(12) United States Patent
Maxey et al.

(10) Patent No.: US 11,342,271 B2
(45) Date of Patent: May 24, 2022

(54) ELECTRONIC COMPONENTS FOR SOFT, FLEXIBLE CIRCUITRY LAYERS AND METHODS THEREFOR

(71) Applicant: LOOMIA Technologies, Inc., New York, NY (US)

(72) Inventors: Madison Thea Maxey, New York, NY (US); Ezgi Uçar, Istanbul (TR); Janett Martinez, Queens, NY (US)

(73) Assignee: Loomia Technologies, Inc., New York, NY (US)

( * ) Notice: Subject to any disclaimer, the term of this patent is extended or adjusted under 35 U.S.C. 154(b) by 68 days.

(21) Appl. No.: 16/657,239

(22) Filed: Oct. 18, 2019

(65) Prior Publication Data

US 2020/0051919 A1 Feb. 13, 2020

Related U.S. Application Data

(63) Continuation of application No. 15/994,351, filed on May 31, 2018, now Pat. No. 10,490,507.

(51) Int. Cl.
*H01L 23/538* (2006.01)
*H01L 23/50* (2006.01)
*H01R 12/77* (2011.01)
*H01L 33/62* (2010.01)

(52) U.S. Cl.
CPC .......... *H01L 23/5387* (2013.01); *H01L 23/50* (2013.01); *H01L 23/5386* (2013.01); *H01L 33/62* (2013.01); *H01R 12/77* (2013.01)

(58) Field of Classification Search
None
See application file for complete search history.

(56) References Cited

U.S. PATENT DOCUMENTS

| | | |
|---|---|---|
| 2014/0225839 A1 | 8/2014 | Dunphy et al. |
| 2015/0097572 A1 | 4/2015 | Wade et al. |
| 2016/0157779 A1 | 6/2016 | Baxi et al. |
| 2018/0191264 A1 | 7/2018 | Lefevre |
| 2018/0260052 A1* | 9/2018 | Karagozler .......... D03D 1/0088 |

* cited by examiner

*Primary Examiner* — Michelle Mandala
(74) *Attorney, Agent, or Firm* — Bookoff McAndrews, PLLC

(57) ABSTRACT

A flexible circuitry layer may comprise a conductive mesh including a circuitry trace; and an interfacing component, comprising: a flexible substrate; a terminal electrically connected to the circuitry trace; and a connector configured to be detachably connected to an external device.

20 Claims, 17 Drawing Sheets

ELECTRONIC COMPONENTS FOR SOFT, FLEXIBLE CIRCUITRY LAYERS AND METHODS THEREFOR

CROSS-REFERENCE TO RELATED APPLICATION

This application is a continuation of and claims the benefit of priority to U.S. application Ser. No. 15/994,351, filed May 31, 2018, the contents of which are incorporated herein by reference in their entirety.

TECHNICAL FIELD

The present disclosure relates generally to the field of electronic components for soft, flexible circuitry layers and methods therefor.

BACKGROUND

It may be desirable to incorporate electronic circuitry into a wide variety soft goods, including textiles (e.g., clothing and/or home goods such as blankets) or upholstered products (e.g., furniture or automotive products). Traditional methods of manufacturing electronic circuitry have resulted in circuitry that is insufficiently flexible to be satisfactorily incorporated into such soft good products. Such traditional methods have also produced circuitry that lacks other desirable properties, such as durability (including washability), adaptability to different applications, and ease of integration.

Therefore, a need exists for a flexible electronic circuitry layer and electronic components that are drapable, durable, adaptable to a wide variety of uses, and compatible with a range of other devices.

SUMMARY

According to certain aspects of the present disclosure, flexible circuitry layers and methods for manufacturing flexible circuitry layers are disclosed.

In one embodiment, a flexible circuitry layer is disclosed, comprising a conductive mesh including a circuitry trace; and an interfacing component, comprising: a flexible substrate; a terminal electrically connected to the circuitry trace; and a connector configured to be detachably connected to an external device.

In accordance with another embodiment, a flexible circuitry layer is disclosed, comprising: a conductive mesh including a circuitry trace; and an interfacing component electronically coupled to the circuitry trace, comprising: a flexible substrate; an integrated circuit configured to control operations of the circuitry trace; and a connector configured to be detachably connected to an external device.

In accordance with another embodiment, a method for manufacturing a flexible circuitry layer is disclosed, comprising: providing a conductive mesh including a circuitry trace; connecting the circuitry trace to a terminal of an interfacing component; applying an insulating layer to the circuitry traces; and applying a urethane or polymer encapsulation layer to the interface.

Additional objects and advantages of the disclosed embodiments will be set forth in part in the description that follows, and in part will be apparent from the description, or may be learned by practice of the disclosed embodiments. The objects and advantages on the disclosed embodiments will be realized and attained by means of the elements and combinations particularly pointed out in the appended claims.

It is to be understood that both the foregoing general description and the following detailed description are exemplary and explanatory only and are not restrictive of the detailed embodiments, as claimed.

BRIEF DESCRIPTION OF THE DRAWINGS

The accompanying drawings, which are incorporated in and constitute a part of this specification, illustrate exemplary embodiments of the present disclosure and together with the description, serve to explain the principles of the disclosure.

DETAILED DESCRIPTION

While principles of the present disclosure are described herein with reference to illustrative embodiments for particular applications, it should be understood that the disclosure is not limited thereto. Those having ordinary skill in the art and access to the teachings provided herein will recognize additional modifications, applications, embodiments, and substitution of equivalents all fall within the scope of the embodiments described herein. Accordingly, the invention is not to be considered as limited by the foregoing description.

Various non-limiting embodiments of the present disclosure will now be described to provide an overall understanding of the principles of the methods described herein for producing flexible, drapable electronic circuitry layers. As discussed above, existing methods fail to produce electronic circuitry layers with suitable electronic input and outputs, as well as connections to outside devices, such as power supplies. Thus, the exemplary embodiments of the present disclosure are directed toward electrical interfaces for transitioning between high-pitch electronic traces (e.g., on flexible circuits used for soft goods) and low-pitch electronic connections, as well as toward electronic inputs and outputs for use with flexible circuits. High-pitch electronic traces may have wide circuitry traces (e.g., formed from conductive mesh), while low-pitch electronic traces may be narrower (e.g., legs on an integrated circuit (IC) package) and may be used with traditional circuitry components. For example, the exemplary embodiments of the present disclosure are directed to circuitry which can be used to connect a flexible circuit to a device, such as a power supply, using a standard connector, such as a USB connector or a pogo pin connector.

One or more examples of these non-limiting embodiments are illustrated in the selected examples disclosed and described in detail with reference to FIGS. 1-13D in the accompanying drawings. Those of ordinary skill in the art will understand that systems and methods specifically described herein and illustrated in the accompanying drawings are non-limiting embodiments. The features illustrated or described in connection with one non-limiting embodiment may be combined with the features of other non-limiting embodiments. Such modifications and variations are intended to be included within the scope of the present disclosure. The examples described with regard to FIGS. 1-13D may be used in large-scale manufacturing.

Figure 1:
FIG. 1 depicts an exemplary soft good incorporating a flexible circuitry layer.
Figure 1:
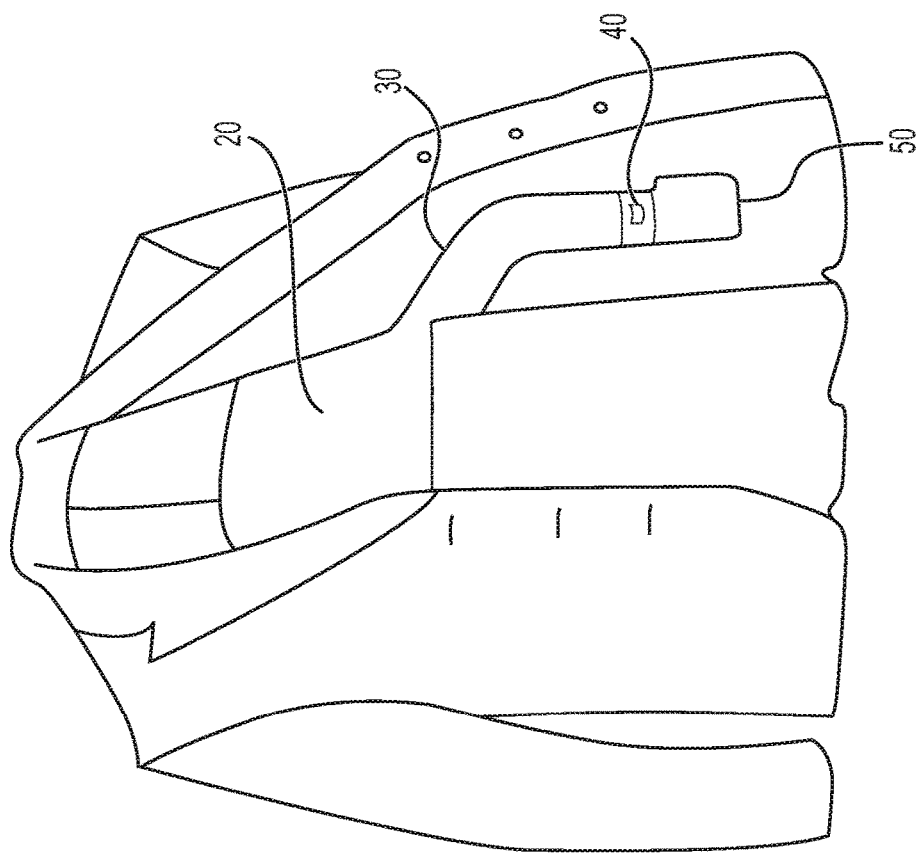

As shown in FIG. 1, a soft good 10 may include a compartment 20 for a flexible circuitry layer 30, which may be connected via an interface 40 to an external device 50. For example, soft good 10 may be an item of clothing, such as a jacket, vest, shirt, pants, shorts, undergarment, sock, or other clothing item. Soft good 10 may also be, for example, an upholstered item such as furniture, a car seat, or another upholstered item. Soft good 10 may also be a hybrid soft and hard good, including, for example, a shoe or a tent. A compartment 20 of soft good 10 may, for example, be a pouch or a pocket. Compartment 20 may be formed, for example, in a lining of soft good 10. Compartment 20 may include a closure (e.g., zipper, hook and loop material, buttons, snaps, etc.) so that a circuitry layer 30 may be removably inserted into compartment 20. In the alternative, compartment 20 may be permanently or substantially permanently closed so that circuitry layer 30 is not removable from compartment 20 by a user. Compartment 20 may be configured (e.g., sized or shaped) for insertion of a circuitry layer 30. For example, compartment 20 may be sized to match a perimeter geometry of circuitry layer 30 (or vice versa—circuitry layer 30 may be formed to match a perimeter geometry of compartment 20). It should be appreciated that circuitry layer 30 may be affixed to or otherwise connected to soft good 10 without the use of compartment 20.

Circuitry layer 30 may be formed of, for example, a flexible or fabric substrate such as a conductive mesh or another textile coated with conductive material. For example, circuitry layer 30 may include a woven textile, a knit fabric, a mesh, or any other type of flexible material. A flexible substrate of circuitry layer 30 may include either natural or synthetic fibers or other materials. For example, a flexible material of circuitry layer 30 may include one or more materials, such as cotton, flax, jute, hemp, modal, bamboo, silk, nylon, velvet, polyester, rayon, or taffeta. A flexible material of circuitry layer 30 may also include a metal or metal alloy material, such as a conductive material. For example, a flexible material of circuitry layer 30 may include materials such as, for example, copper, nickel, silver, tin, and/or cobalt. For convenience, a flexible substrate of circuitry layer 30 may be referred to herein as a "conductive mesh." However, it will be understood that the disclosures are not limited to a conductive mesh and may include any other suitable material, such as those described above. Circuitry layer 30 may be of any suitable size and/or shape.

Circuitry layer 30 may include an interfacing component 40. Interfacing component 40 may be, for example, an interconnect. Interfacing component 40 may serve to connect a circuitry layer 30 with any desired type of external component, such as external device 50. Interfacing component 40, examples of which will be discussed in further detail below, may include components which control portions of circuitry layer 30. Interfacing component 40 may also serve to interface circuitry layer 30 with an external device 50. Circuitry layer 30 may include circuitry traces that are of high pitch. That is, traces of circuitry layer 30 may be relatively wide. These high pitch traces may be incompatible with traditional types of connections to other circuitry components. Therefore, interfacing component 40 may form a pitch transition zone. For example, interfacing component 40 may enable a transition from the high-pitch flexible traces of circuitry layer 30 to lower pitch electrical connections used in standard components (e.g., connections to an anode and cathode of an LED such as an SMD 0603 LED), which may be a part of (e.g., located on) interfacing component 40 or connected to interfacing component 40.

Interfacing component 40 may be connectable to an external device 50. Interfacing component 40 may be fixedly connected to external device 50 or detachably connected to external device 50. External device 50 may be, for example, a power source, a controller, a network-enabled device, a processor, and/or memory. External device 50 may, for example, provide a 5 V, 1 A power supply. External device 50 may be placed, for example, inside a soft good 10. For example, external device 50 may be configured to be stored in a pocket of a clothing item. Soft good 10 may be configured so that circuitry layer 30 may be connected to external device 50 via a connector on interfacing component 40 and/or external device 50 while soft good 10 is worn or otherwise used. External device 50 may be able to be swapped out if, for example, a battery in external device 50 is depleted or if external device 50 otherwise is desired to be replaced.

Figure 2A:
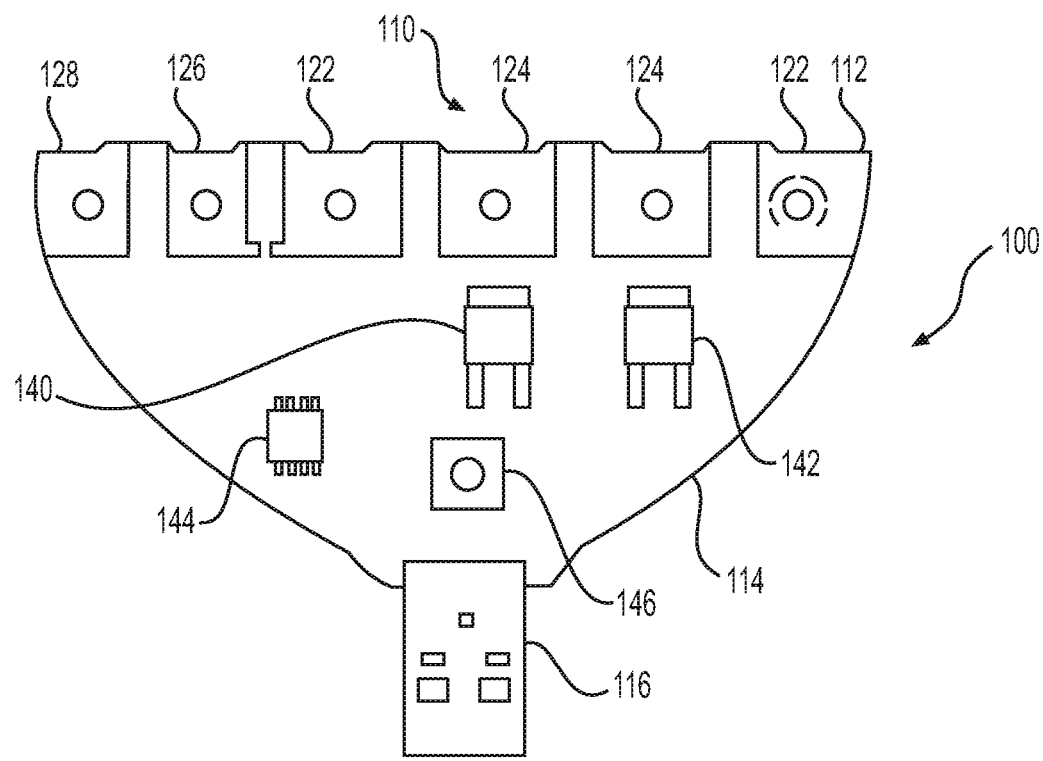
FIGS. 2A and 2B depict exemplary interfacing components.

FIG. 2A depicts an exemplary interfacing component 100, which may have any of the properties of interfacing component 40, described with regard to FIG. 1, above. Interfacing component 100 may include, for example, interface portion 110, (including one or more terminals 112), a substrate 114, and a connector 116. Interface portion 110 may facilitate mechanical and/or electrical connection between interfacing component 100 and an input and/or output (discussed in further detail below). Interfacing component may be connected to an input and/or output via, for example, circuitry traces such as those included in a circuitry layer such as circuitry layer 30, described with regard to FIG. 1, above.

Interface portion 110 may include one or more terminals 112. Terminals 112 may be of a variety of types. For example, one or more terminals 112 may be positive voltage terminals 122. Positive voltage terminals 122 may serve to provide current to, for example, circuitry layer 30. For example, positive voltage terminal 122 may connect to, provide, and/or receive a 5V supply. One or more terminals 112 may be input/output terminals 124. Input/output terminals 124 may be connected to one or more input and/or output devices of a circuit (e.g., of circuitry layer 30). Input/output terminals 124 may include a variety of functionality. For example, input/output terminals 124 may connect to one or more MOSFETs or other types of circuits. Input/output terminals 124 may support functions including, for example, lighting, heating, cooling, vibration, sensing, switching, and/or communicating. Input/output terminals 124 may support digital and/or analog functionality. Inputs and/or outputs (discussed futher below) may be operative to perform any of these functions or other functions. Terminals 112 may also include one or more analog terminals 126. Analog terminal 126 may support any of the functions described above with regard to input/output terminals 124. Terminals 112 may also include one or more ground terminals 128. Ground terminal 128 may serve to complete a circuit formed on circuitry layer 30 and/or provide any other necessary grounding function.

Interfacing component 100 may also include a substrate 114. Substrate 114 may be made of any suitable material. For example, substrate 114 may be made of flexible printed circuit board (PCB) material. For example, substrate 114 may include 0.4 mm thick flexible PCB. In addition or in the alternative, substrate 114 may include other materials, including flexible PCB and/or rigid PCB of different thicknesses and flexibilities. For example, flexible PCB used for substrate 114 may have a thickness above 1 mm. Rigid PCB used for substrate 114 may have a thickness above 4 mm. Substrate 114 may include one material or multiple different materials, including materials of different thicknesses.

A variety of elements or components may be mounted on substrate 114. For example, one or more electronic components 140, 142 may be mounted on substrate 114. Electronic components 140, 142 may include the same or different circuitry components. For example, electronic component 140 and/or electronic component 142 may be a MOSFET. For example, a MOSFET electronic component 140 may be used along with one output element on, for example, circuitry layer 30. For example, a MOSFET electronic component 140 may be associated with an input and/or output element connected to, for example, a terminal 112 (e.g., terminal 124). Another MOSFET electronic component 142 may be used along with another output element on, for example, circuitry layer 30. For example, MOSFET electronic component 142 may be associated with an input and/or output element connected to, for example, a terminal 112 such as terminal 124. For example, electronic component 140, 142 may provide a 2.6 A signal to an output element. While the foregoing description uses MOSFET packages as exemplary electronic components 140, 142, electronic components 140, 142 may include any suitable components.

A control element 144 may also be mounted on substrate 114. Control element 144 may be, for example, an integrated circuit (IC). Control element 144 may interface with any of the other components of interfacing component 100. For example, one or more terminals 112 may serve to connect input and/or output elements of, for example, circuitry layer 30 with one or more pins of control element 144. Control element 144 may be configured to provide signals to, for example, elements of interfacing component 100 such as electronic components 140, 142. For example, a control element 144 may be configured to provide a heating algorithm which turns on and off different heating panels and/or turns on and off LED lights.

Interfacing component 100 may also include one or more elements 146. Element 146 may be, for example, a switch. For example, element 146 may include a button which, when depressed or otherwise activated, serves to control operation of, for example, interfacing component 100 and/or a circuitry layer such as circuitry layer 30. Element 146 may also include, for example, awake circuitry. Awake circuitry may include, for example, a power source and may serve to keep elements of interfacing component 100 and/or circuitry layer 30 active.

Interfacing component 100 may also include one or more connectors 116. Connector 116 may be any type of connector for interfacing with, for example, external device 50. For example, connector 116 may be a USB connector of any type (e.g., USB 2.0, USB 3.0, micro USB, mini USB, USB-A, USB-B, USB-C, or any combination of the above). For example, connector 116 may be a 4-pin USB connector that may connect to a standard 5 V power bank, which may provide a 1 A power supply. Connector 116 may also be, for example, a pogo-pin connector. Connector 116 may also be any other type of connector (e.g. a lightning connector). Connector 116 may be either a plug or a receptacle (i.e., a male connector or a female connector). Connector 116 may be mated with, for example, a portion of external device 50. For example, connector 116 may be a plug, and external device 50 may include one or more receptacles.

Figure 2B:
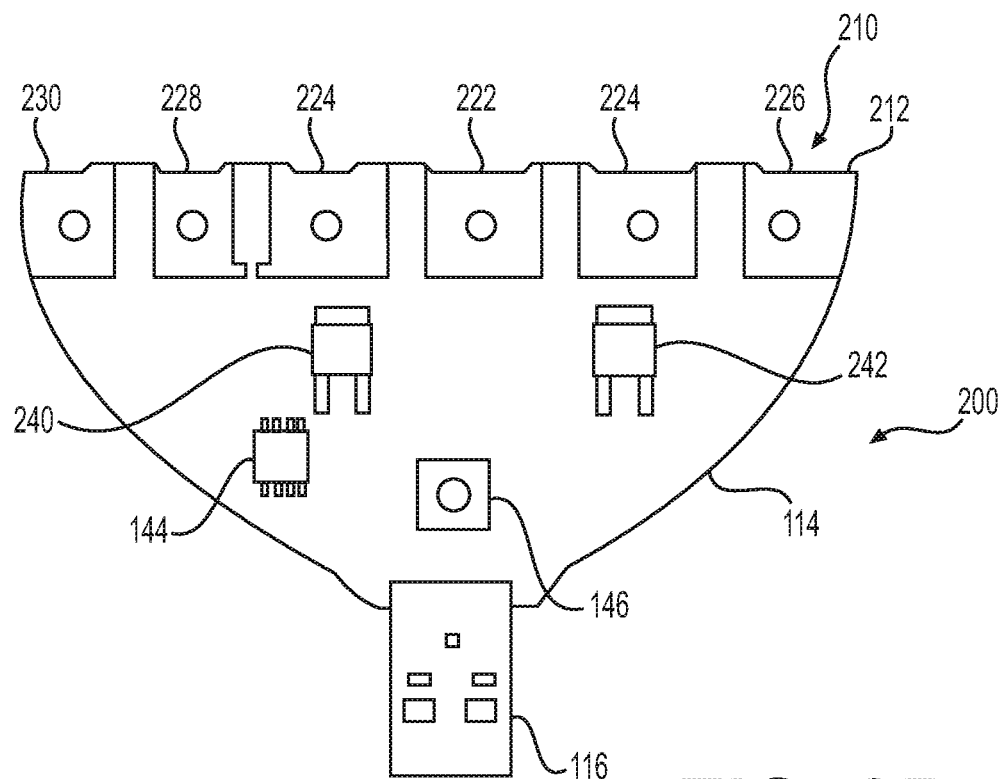

FIG. 2B depicts a further exemplary interfacing component 200. Interfacing component 200 may have any of the features of interfacing components 40 and/or 100, described above. Interfacing component 200 may include, for example, interface portion 210 (including one or more terminals 212), a substrate 114, and a connector 116. Interface portion 210 may facilitate mechanical and/or electrical connection between interfacing component 200 and an input and/or output (discussed in further detail below). Interfacing component 100 may be connected to an input and/or output via, for example, circuitry traces such as those included in a circuitry layer such as circuitry layer 30, described above.

Interface portion 210 may include one or more terminals 212. Terminals 212 may be of a variety of types and may have any of the properties of terminals 112. One or more terminals 222 may be input/output terminals 224, which may have any of the properties of input/output terminals 124. Terminals 212 may also include one or more analog terminals 226. Analog terminal 226 may support any of the functions described above with regard to analog terminal 126. Terminals 212 may also include one or more ground terminals 228. Ground terminal 228 may have any of the features of ground terminal 128. Terminals 212 may also include one or more further terminals 230, which may be any of the types of terminals described above or may have any other functionality.

A variety of elements or components may be mounted on substrate 114. For example, one or more electronic components 240, 242 may be mounted on substrate 114. Electronic components 240, 242 may have any of the properties of electronic components 140, 142, described above.

Figure 3A:
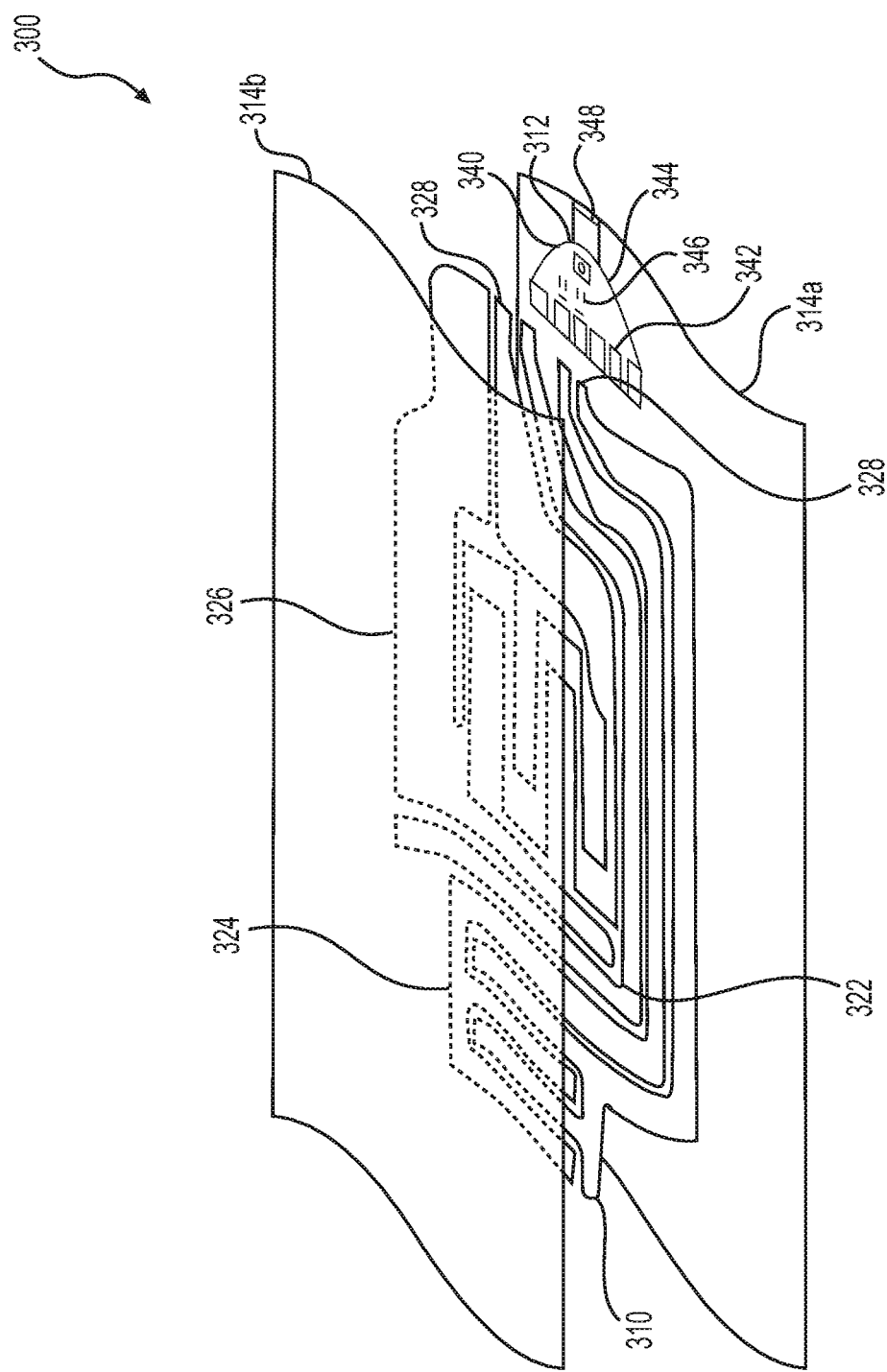
FIGS. 3A, 3B, and 4 depict exemplary flexible circuitry layers.
Figure 3B:
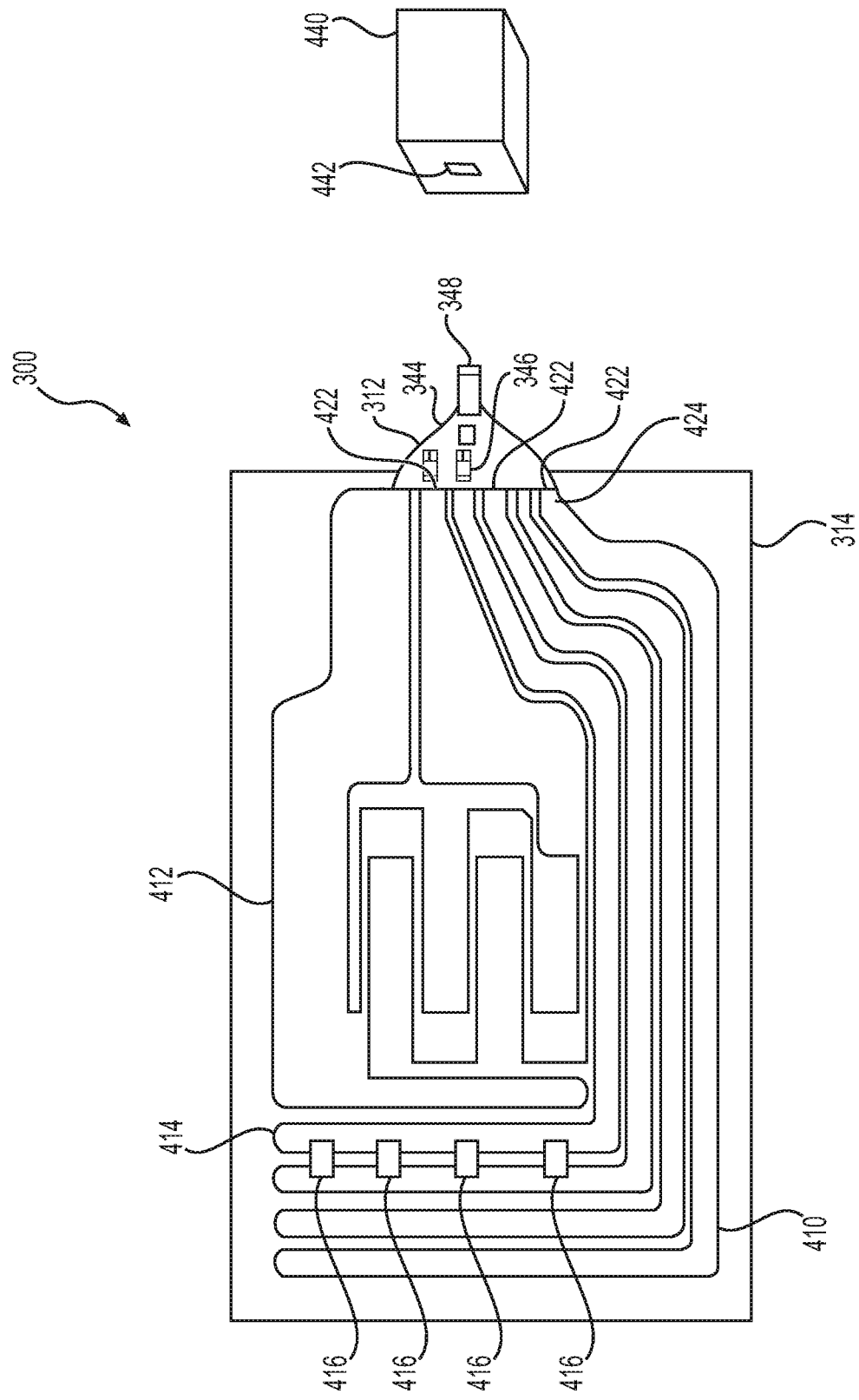

FIGS. 3A-3B show exemplary circuitry layers 300, which may have any of the qualities of circuitry layer 30, described above. Circuitry layer 300 may include, for example, a circuitry trace layer 310, which may be connected to an interfacing component 312, and an insulating layer 314 (including a first insulating layer 314*a* and a second insulating layer 314*b*).

Circuitry trace layer 310 may include, for example, any of the flexible materials and/or any of the conductive materials described above with regard to circuitry layer 30 as described with regard to FIG. 1. Circuitry trace layer 310 may be manufactured by, for example, subtractive manufacturing (see FIGS. 5A-5B). For example, circuitry trace layer 310 may be manufactured using mechanical subtractive manufacturing (e.g., using a CNC cutter such as a laser or a die cutter to mechanically remove portions of conductive material such as a conductive mesh, as described below with regard to FIG. 5A). In addition or in the alternative, circuitry trace layer 310 may be manufactured using chemical subtractive manufacturing (e.g., using a mask and/or a chemical such as an etchant to selectively remove portions of a conductive material from a substrate, as described below with regard to FIG. 5B). Circuitry trace layer 310 may include different regions. For example, circuitry trace layer 310 may include a region 322 on which components such as lights (e.g., LED lights) may be mounted. Circuitry layer 310 may further include a capacitive touch portion 324, which may be reactive to touch or other deformation by, for example, a user. Capacitive touch portion 324 may be used to, for example, control elements of circuitry layer 300. Circuitry trace layer 310 may also include a heating portion 326 which is designed to generate and transmit heat. For example, heating portion 326 may be used to transmit heat to a user, such as a wearer. Other regions of circuitry trace layer 310 may include, for example, areas which provide active cooling, form an antenna, and/or hold sensors. Circuitry trace layer 310 may also include one or more electrodes 328, which may be used for forming electrical connections with other parts.

Circuitry layer 300 may also include one or more insulative layers 314. For example, circuitry layer 300 may include a bottom insulative layer 314a and a top insulative layer 314b. Insulative layer(s) 314 may be made of a hydrophobic material which may protect components of circuitry layer 300. Insulative layer 314 is described in further detail with regard to FIG. 3B, below.

Circuitry layer 300 may further include an interfacing component 312. Interfacing component 312 may have any of the qualities of interfacing components 40, 100, or 200, described above. For example, interfacing component 312 may be an interconnect for connecting circuitry trace layer 310 with other circuitry components, including controls for electrical components, power, awake circuits, transmitters, memory, processors, and/or any other component which may be used in an electric circuit. Interfacing component 312 may include, for example, one or more terminals 342 for connecting to one or more electrodes 328. Terminals 342 may have any of the qualities of terminals 112 and/or 212, described above. Terminals 342 may be configured to support different functions of circuitry layer 300. For example, terminals 342 may include different types of inputs and/or outputs. Interfacing component 312 may also include a substrate 344. Substrate 344 may have any of the qualities of substrate 114, described above. Substrate 344 may be rigid, flexible, or a combination of rigid and/or flexible. Substrate 344 may also include several connected substrates. For example, substrate 344 may include multiple types of substrates, for example both a flexible substrate and a rigid substrate. Where multiple substrates 344 are used, substrates 344 may have different thicknesses.

Interfacing component 312 may also include one or more component elements 346. Component element 346 may have any of the qualities of elements 140, 142, 144, 146, 240, and/or 242, described above. Component elements 346 may include, for example, circuits, such as, by way of example, sleep/awake circuits, controllers, memory, processors, switches, etc. Interfacing component 312 may also include a connector 348 for connecting circuitry layer 300 to an external component such as, for example, a power supply, a networked device (e.g., a computer, portable device, Bluetooth-enabled device, etc.), and/or another circuitry layer 300. Connector 348 may have any of the properties of connector 116, described above. Connector 348 may be a universal-type connector, such as any type of USB connector, a magnetic pogo pin connector, a JST connector, a headphone jack, or another type of connector used by other devices. Interfacing component 312 may also include multiple connectors 348.

As shown in FIG. 3B, circuitry layer 300 may include an alternative circuitry trace layer 410. Circuitry trace layer 410 may have any of the qualities of circuitry trace layers 30 and/or 310. Circuitry trace layer 410 may include different regions. For example, circuitry trace layer 410 may include a heating portion 412, which is configured to generate and transmit heat. For example, heating portion 414 may be used to transmit heat to a user, such as a wearer. As a further example, circuitry trace layer 410 may include a region 414 on which components (e.g., components 450, as discussed below), such as lights (e.g., LED lights) may be mounted. While a capacitive touch portion is not shown as a portion of circuitry trace layer 410, circuitry trace layer 410 may include such a portion. Circuitry trace layer 410 may also include one or more electrodes 422, which may be used for forming electrical connections with other parts. One or more electrodes 422 may be connected to one or more terminals 342 (see FIG. 2A) of interfacing component 312 with, for example, conductive epoxy, conductive ink, conductive bonding material, and/or other conducting material 424.

One or more components 416 may be mounted on circuitry trace layer 410 (or any of the other circuitry trace layers described herein). Component 416 may be for example, an input and/or an output device. For example, one or more components 416 may include, for example, lights such as LED lights, vibration motors, Bluetooth transmitters, GPS transmitters, biometric sensors, antennas, transceivers, switches, accelerometers, resistors, batteries, thermistors, temperature sensors, tilt pins, flex sensors, photocells, etc. Components 416 may include for example, one or more rigid electrical components, and/or one or more substrates (e.g., a rigid and/or flexible board). Electrical traces may be formed on the substrate, extending from the rigid electrical component. Each component 416 may be configured for communicating with another component 416 and/or an external device via wired and/or wireless communication. For example, component 416 may be configured for communicating wirelessly with an external device. In addition or in the alternative, each component 416 may be configured to communicate with an external device via interfacing component 312.

One or more components 416 may interact with elements of interfacing component 312, for example component elements 346. For example, component elements 346 may receive input signals from components 416 and/or provide control over components 416. For example, elements of interfacing component 312 may be operable to switch on or off components 416 or to adjust one or more components 416. For example, interfacing component 312 may include a switch to change, for example, a heat setting and/or a light pattern.

Components 416 may be electrically connected to circuitry trace layer 410 using, for example, conductive ink, conductive epoxy, ultrasonic welding, and/or other methods. Such conductive ink or conductive epoxy may have properties such that an electrical connection may be formed between portions of components 416 (e.g., electrical traces formed on a substrate) and circuitry trace layer 410. While not shown in FIG. 3A, components 416 may also be used with, for example, circuitry trace layer 310 (e.g., in region 322) or any other circuitry layer. Circuitry trace layers 310 and 410 are merely exemplary of the types of circuitry trace layers which may be used as a portion of circuitry layer 300.

Components 416 may also be mechanically coupled to circuitry trace layer 410 (or any other circuitry trace layer). For example, components 416 may be mechanically coupled using, e.g., electrically-insulative or electrically-conductive thread or another similar material (e.g., wire). Components 416 may be perforated in advance to accept thread or another material used to mechanically couple components 416 to circuitry trace layer 410.

After one or more electrodes (e.g., 328 and/or 422) are electrically connected to one or more terminals 342 of interfacing component 312, and after any components 416 are electrically connected to a circuitry trace layer (such as circuitry trace layers 30, 310, and/or 410), an insulative layer 314 may be placed over the circuitry trace layer (e.g., circuitry trace layers 30, 310, and/or 410), components 416, and/or portions of interfacing component 312 such as terminals 342 or substrate 344. For example, insulative layer 314 may encase other components of circuitry layer 300. Insulative layer 314 may, for example, include insulative layers 314a and 314b placed on a bottom and top side, as shown in FIG. 3A. Insulative layer 314 may serve as an electrical insulator, as well as a waterproof barrier preventing liquids from coming into contact with conductive and other electrical components of circuitry layer 300. In one embodiment, insulative layer 314 may be a hydrophobic coating. Insulative layer 314 may be made from, for example: manganese oxide polystyrene, zinc oxide polystyrene, and/or precipitated calcium carbonate. Insulative layer 314 may be applied, for example, as a liquid or as a film (e.g., thermoplastic polyurethane (TPU)). For example, where insulative layer 314 is a liquid, insulative layer 314 may be applied by coating, spraying, rolling, or the like. Where insulative layer 314 is a film, insulative layer may be, for example, a two-part film and may have press on or iron on qualities. Insulative layer 314 may be flexible—e.g., bendable, drapable, and/or stretchable. In addition or in the alternative to insulative layer 314, an oleophobic material may be applied in order to protect against water, oil, dirt, and/or other contaminants. Circuitry layer 300 may be washable without compromising the functionality of the circuitry layer 300.

Connector 348 may be connectable to an external device, such as external device 440, which may have any of the qualities of external device 50, described above. External device 440 may include a receptacle 442, which may be configured to receive a compatible connector 348. For example, receptacle 442 may be configured to receive a USB connector, a pogo pin connector, a JST connector, a headphone jack, and/or any other type of connector (e.g., connectors described above with regard to connector 116, as described with regard to FIGS. 2A-2B). External device 440 may include one or more receptacles 442, although only one receptacle 442 is shown in FIG. 3B. Multiple external devices 440 may be used with a given circuitry layer 300, simultaneously or at different times. External device 440 may be used to provide power to circuitry layer 300. For example, external device 440 may be a 5V, 1 A power supply.

Figure 4:
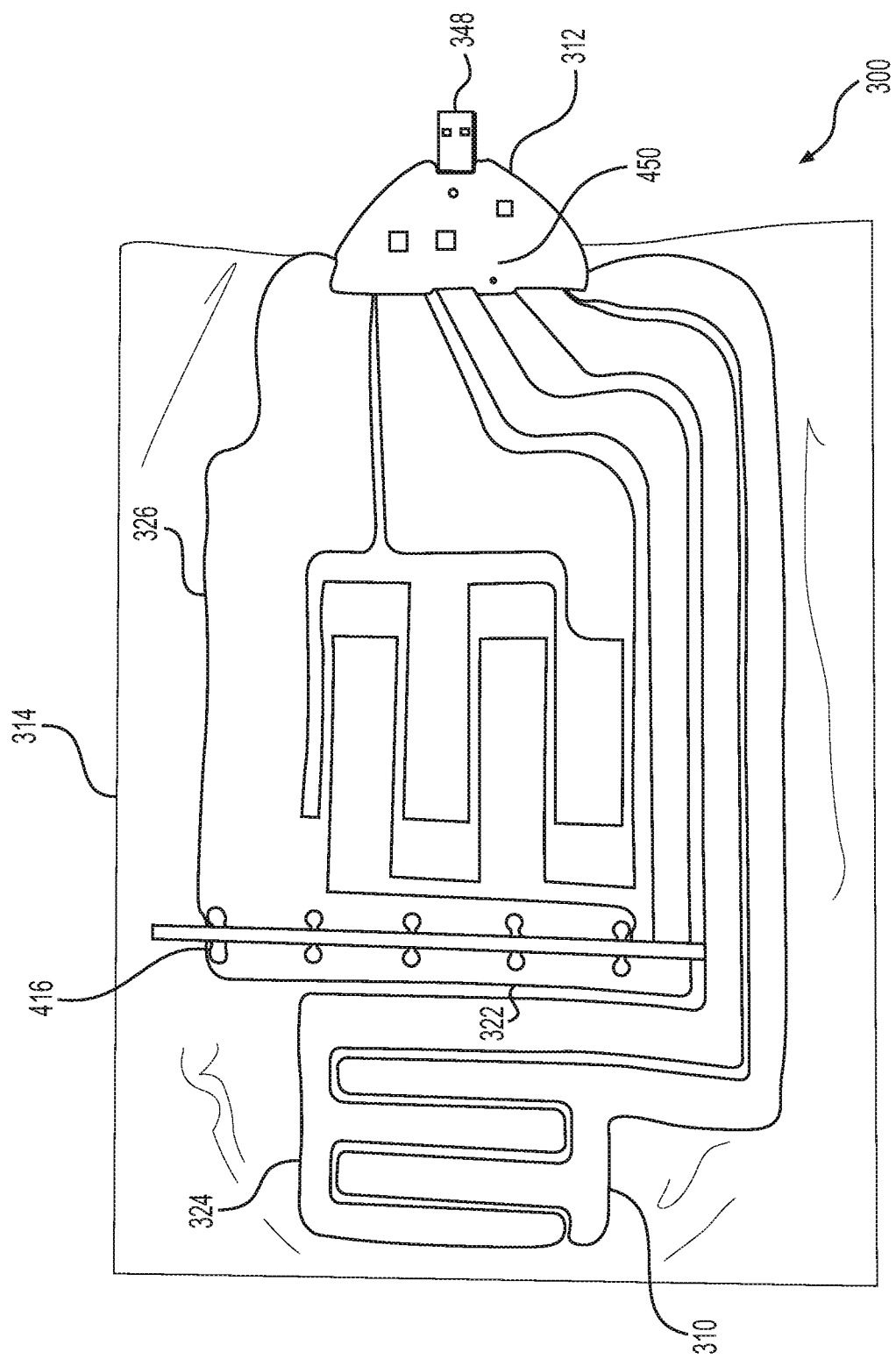

As shown in FIG. 4, an interfacing component 312 and/or other portions of circuitry layer 300 may be encapsulated with a material 450. Circuitry layer 300 may have any of the qualities described above. For example, material 450 may be an insulating, hydrophobic, and/or oleophobic material as described above with regard to material 314. In addition or in the alternative, material 450 may be a liquid silicone, urethane, polymer, and/or a resin. For example, material 450 may be a liquid that is applied to interfacing component 312 by dipping, spraying, painting, and/or another mechanism. In addition or in the alternative, material 450 may be applied via a molding process. Material 450 may be cured after application so that material 450 is solid. Material 450 may be hard and/or flexible. Material 450 may be applied so that it overlaps other portions of circuitry layer 300, such as circuitry trace layer 310 (or any other circuitry trace layer) and/or insulative layer 314. For example, material 450 may serve to seal interfacing component from liquids, dust, or other materials which may serve to harm the function of interfacing component and/or other portions of circuitry layer 300 (e.g., components 416). For example, material 450, alone or in conjunction with insulative layer 314, may enable circuitry layer 300 to be washable and durable.

Figure 5A:
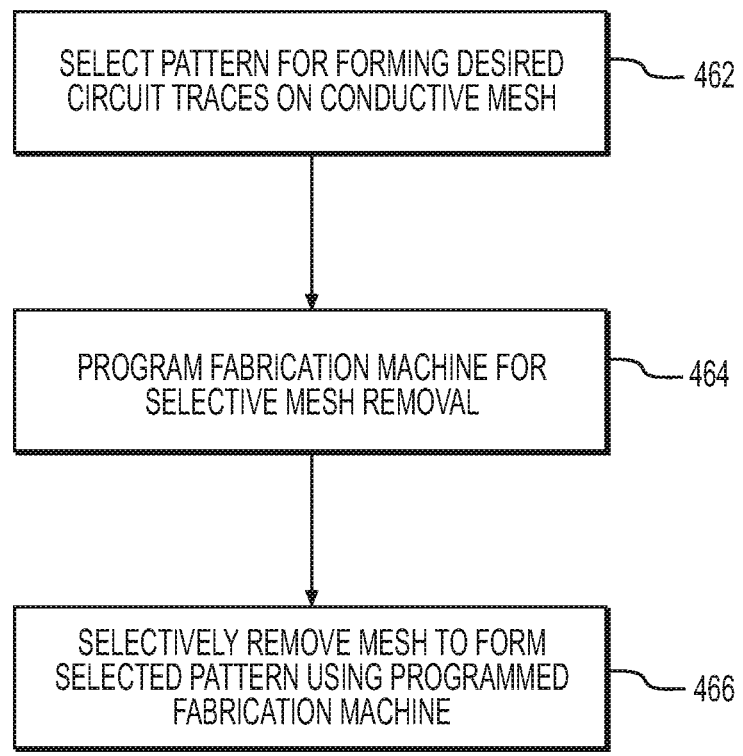
FIGS. 5A and 5B depict exemplary subtractive manufacturing methods for forming circuitry traces.
Figure 5B:
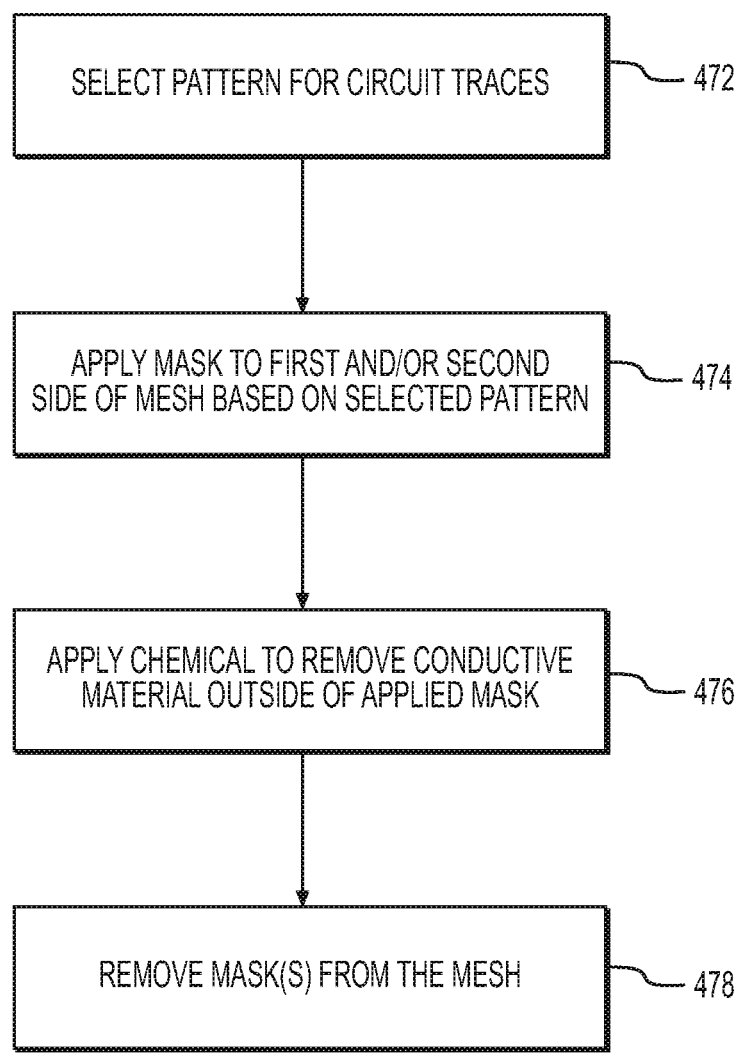

FIGS. 5A-5B show exemplary methods for using subtractive manufacturing to form, for example, circuitry trace layers 310 and/or 410. FIG. 5A describes an exemplary method 460 for using mechanical subtractive manufacturing to form, for example, circuitry trace layers 310 and/or 410. For example, in step 462, a pattern may be selected for forming circuitry traces on a substrate such as a conductive mesh (while the term conductive mesh may be used herein for convenience, it will be understood that the substrate used could be any of the types of substrates described above, for example with regard to circuitry layer 30). A pattern may be selected in step 462 based on design rules. For example, as described above, circuitry trace layers 310 and/or 410 may include regions with varying functionality (e.g., heating, lighting, and/or capacitive touch). In step 464, a machine may be programmed to cut circuitry trace layer 310 and/or 410 according to desired a pattern. A fabrication machine used in step 464 may be a cutter, such as a CNC or other automated cutter. If a manual fabrication machine (e.g., a manual cutter) is used, step 464 may be omitted. In step 466, a conductive mesh or other type of flexible material may be cut according to the selected pattern using the fabrication machine. A stretchable circuitry layer may be produced, depending on the flexible mesh used to construct circuitry trace layer 310 and/or 410 and/or the cutting techniques employed. Stretching may not result in an appreciable change in the resistance of circuitry trace layers 310 and/or 410.

FIG. 5B shows an exemplary chemical subtractive manufacturing method 470, which may also or alternatively be used to manufacture a circuitry trace layer 310 and/or 410. A flexible mesh (while the term flexible mesh may be used herein for convenience, it will be understood that the substrate used could be any of the types of substrates described above, for example with regard to circuitry layer 30) may be coated with a conductive material on one or both sides. The conductive material may have any of the properties of conductive materials described with regard to circuitry layer 30. In step 472, a pattern may be selected for forming desired circuit traces from a flexible conductive material. In step 474, a mask may be placed over at least a portion of conductive material on one or both sides of a mesh. The applied mask may be in the shape or pattern of a desired circuit trace. At least a portion of conductive material may remain uncovered by the mask. The mask may be resistant to etching by a chemical, such as a chemical etchant configure to remove conductive material from the mesh. In one embodiment, the mask may be formed by using a CNC (e.g., die or laser cutter) or other cutter. The mask may be any desired substance or material (e.g., an etch-resist) that is resistant to the selected chemical, e.g., etchant, that may be applied to the mesh in step 476. For example, such a resistant material may be applied via spraying or rolling. In step 476, after the mask is applied, a chemical such as an etchant may be applied to all or portions of the mesh, including portions having conductive material. For example, a chemical may be a liquid etchant such as ferric chloride. The chemical may be applied via, for example, spraying or dipping. The effect of the chemical may be to remove conductive material from areas not covered by the mask. The chemical may subsequently be removed or neutralized (e.g., with a basic solution, such as sodium bicarbonate). In step 478, the mask may be removed from the mesh, leaving behind a circuitry trace layer 310 and/or 410.

Figure 6:
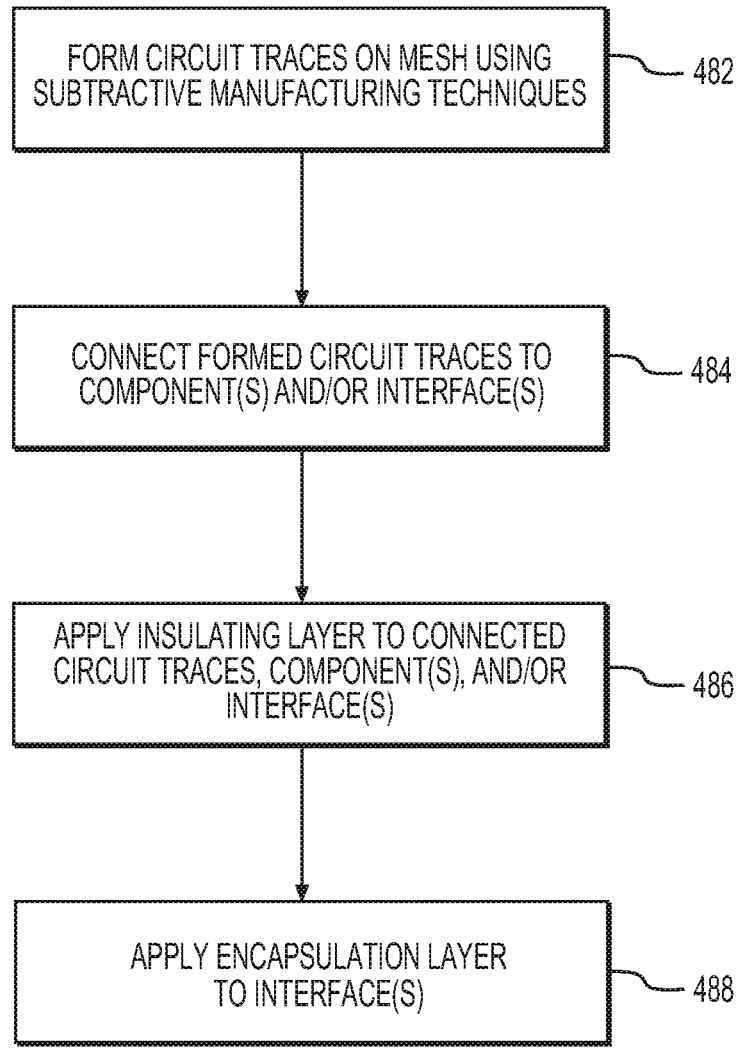
FIG. 6 depicts an exemplary method for manufacturing a flexible circuitry layer.

FIG. 6 shows a process 480 for constructing a circuitry layer such as circuitry layer 300. In step 482, a flexible circuitry trace (e.g., flexible circuitry trace layers 310 and/or 410) is formed and/or provided (e.g., by the methods described with regard to FIGS. 5A and 5B). In step 484, a component such as component 416 may be attached to a flexible circuitry trace layer provided in step 482. In addition or in the alternative, the flexible circuitry trace layer provided in step 482 may be attached to an interfacing component such as interfacing component 312, as described above. Attaching a flexible circuitry trace layer to a component 416 and/or an interfacing component 312 may be done in any order. For example, some or all components 416 may be attached before an interfacing component 312, or vice versa. A component 416 or interfacing component 312 may be attached using any method, such as those described above. For example, a component 416 or an interfacing component 312 may be attached using a conductive bonding material, such as conductive thread, conductive epoxy, conductive ink, etc. In step 486, an insulative layer such as insulative layer 314, may be applied as described above. The insulative layer applied in step 486 may cover portions of the provided circuitry trace layer, the attached component, and/or the attached interface component. In step 488, an interfacing component may be encapsulated. For example, as described above, an interfacing component such as interfacing component 312 may be encapsulated with a material such as material 450.

Figure 7A:
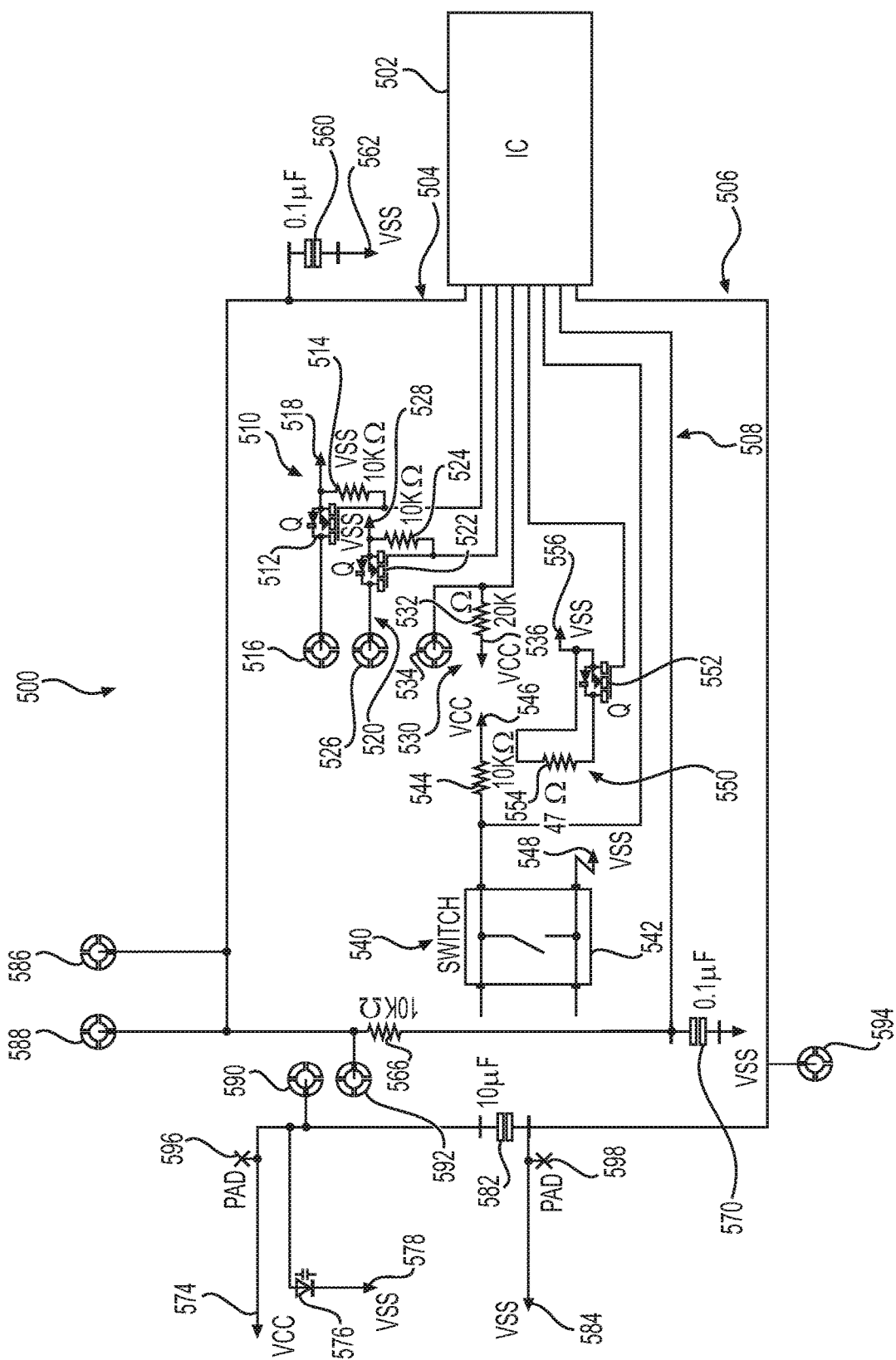
FIGS. 7A and 7B depict exemplary circuitry configurations of an interfacing component.
Figure 7B:
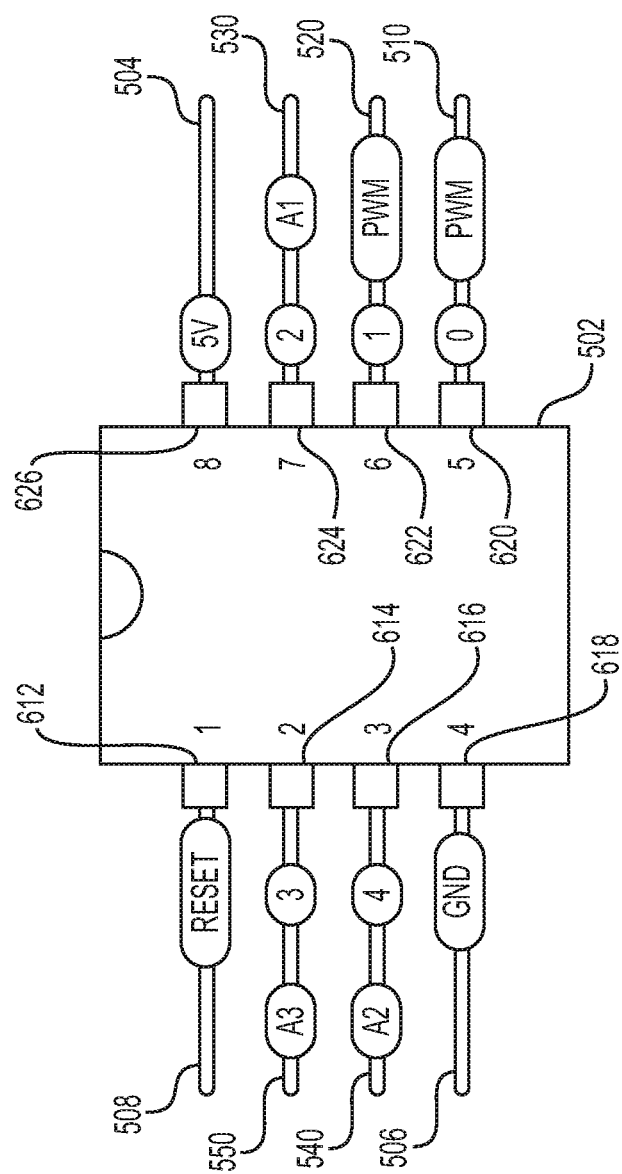

FIGS. 7A-7B show exemplary configurations of an interfacing component 312. FIG. 7A shows a circuitry diagram for an exemplary circuit 500 on interfacing component 312. Circuit 500 may include an IC 502, which may have multiple pins for connecting to other portions of circuit 500. IC 502 may be, for example, a control element such as control element 144 or a component such as component 346, described above. Circuit 500 may have circuitry 504 for providing a positive voltage, circuitry 506 for providing a ground, and reset circuitry 508. IC 502 may have a first digital output 510. First digital output 510 may include, for example, a transistor 512. Transistor 512 may be, for example, a field-effect transistor such as a MOSFET. For example, transistor 512 may be a 2.7 A, 30 V, 0.026 ohm, 10 V, 1.8 V MOSFET. Transistor 512 may serve any known function of a transistor, which are not elaborated here. First digital output 510 may also include a resistor 514. For example, resistor 514 may be a 10 kiloohm transistor. First digital output 510 may also include a mount pad 516. Mount pad 516 may be, for example, a terminal such as terminals 112, 212, and/or 342. For example, mount pad 516 may be, for example, terminals such as input/output terminals 124 and/or 224. First digital output 510 may also include a connection to ground 518 and/or a connection to a positive voltage input. One or more components of first digital output 510 may be, for example, a component such as component 140, 142, 240, 242, and/or 346, as described above. Digital output 510 may be used to, for example, operate one or more components 416, as described above. For example, components 416 may be lights such as LEDs, and digital output 510 may be operative to turn on and off such LEDs.

Circuit 500 may also include a second circuitry for a second digital output 520. Second digital output 520 may have any of the features of first digital output 510. For example, second digital output 520 may have a transistor 522, which may have any of the features of transistor 512. Second digital output 520 may also include a resistor 524. For example, resistor 524 may be a 10 kiloohm resistor. Alternatively, resistor 524 may have any suitable value. Second digital output 520 may also have a mount pad 526, a connection to ground 528, and/or a connection to a positive voltage input. Mount pad 526 may be, for example, a terminal such as terminals 112, 212, and/or 342. For example, mount pad 526 may be, for example, terminals such as input/output terminals 124 and/or 224. One or more components of second digital output 520 may be, for example, a component such as component 140, 142, 240, 242, and/or 346, as described above. First digital output 510 and second digital output 520 may also include additional components to provide additional and/or alternative functionality.

Circuit 500 may also include circuitry for an analog input 530. For example, analog input 530 may include a pullup resistor, such as resistor 532. For example, resistor 532 may be a 10 kiloohm resistor. In the alternative, resistor 532 may have any other suitable value. Analog input 530 may also include a mount pad 534, a connector to a positive voltage source 536, and/or a connection to ground. Mount pad 534 may be, for example, a terminal such as terminals 112, 212, and/or 342. For example, mount pad 543 may be an analog terminal such as analog terminals 126 and/or 226. One or more components of analog input 530 may be, for example, a component such as component 146 and/or 346, as described above. For example, an analog input 530 may be connected to sensors such as a thermistor, a temperature sensor, a tilt pin, a flex sensor, and/or a photocell.

Circuit 500 may also include circuitry for a switch 540. Switch circuitry 540 may include, for example, a switch 542. Switch 542 may be in the form of any circuitry that is known or may become known in the art. Switch 542 may be a momentary switch. Switch circuitry 540 may also include one or more resistors 544. For example, resistor 544 may be a 10 kiloohm resistor. Switch circuitry 540 may also include a connection to a positive voltage source 546 and/or a connection to ground 548. One or more components switch circuitry 540 may be, for example, a component such as component 146 and/or 346, as described above.

Circuit 500 may further include aawake circuitry 550. Aawake circuitry 550 may serve to, for example, keep circuitry "aawake" or functioning. Aawake circuitry 550 may include, for example, a transistor 552. Transistor 552 may have any of the qualities of transistor 512 and/or 522. Aawake circuitry 550 may also include one or more resistors 554. For example, resistor 554 may be a 47 ohm resistor. Aawake circuitry 550 may also include a connection to ground 556 and/or a connection to a positive voltage source. Aawake circuitry 550 may also include a battery pack. Such a battery pack may serve to provide current with which to keep circuitry aawake. One or more components aawake circuitry 550 may be, for example, a component such as component 146 and/or 346, as described above.

Circuit 500 may also include other features. For example, circuitry 504 coming from a positive voltage source may include a capacitor 560, which may be, for example, a 0.1 microfarad capacitor. Capacitor 560 may be, for example, wired in parallel to other elements of circuitry 504. Capacitor 560 may also be connected to ground circuitry 506. Capacitor 560 may serve as a bypass cap to filter out rogue signals. Another, larger (e.g., 100 microfarad) capacitor may be used to filter out larger signals closer to the battery pack. Circuitry 504 may also include a resistor 566. Resistor 566 may be, for example, a 100 kiloohm resistor. Resistor 566 may be on reset circuitry 508. For example, resistor 566 may serve as a pullup resistor which may function to avoid a floating pin that could disrupt electronic function. Circuitry 504 and/or circuitry 508 (reset circuitry) may also include a capacitor 570 (e.g., a 0.1 microfarad capacitor).

Circuitry 504 may be connected to ground circuitry 506 (e.g., at connection 574). A diode 576 may be connected to circuitry 504 and/or ground circuitry 506 (e.g., at connection 578). Diode 576 may be, for example, a bidirectional diode. Diode 576 may be for example a transient voltage suppressor (TVS) diode which may be used to diffuse static when, e.g., circuit 500 is placed in a dryer. Circuitry 504 and/or ground circuitry 506 may also include, for example, a capacitor 582. For example, capacitor 582 may be a 10 microfarad capacitor. Capacitor 582 may be connected to, e.g., ground circuitry 506 (e.g., at connection 584) and/or circuitry 504 (e.g., at connection 574).

Circuitry 504 may also be connected to mount pads 586 and/or 588. Mount pads 586 and/or 588 may be, for example, terminals such as terminals 112, 212, and/or 342. For example, mount pads 586 and/or 588 may be, for example, terminals such as positive voltage outputs 122 and/or 222. Circuit 500 may also include one or more fuse mount pads 590, 592. For example, fuse mount pads may be used to mount a thermal fuse across a voltage source (e.g., circuitry 504 and/or circuitry 506) to cut off circuit 500 if an application (e.g., a heating application) overheats. In an alternative, a thermal fuse may be fused shut with a jumper for non-heating application or can be used to protect from excessive current in a circuitry layer (e.g., circuitry layer 30). Circuitry 504 may be connected to a mount pad 594. Mount pad 594 may be, for example, a terminal such as terminals 112, 212, and/or 342. For example, mount pad 594 may be, for example, a terminal such as ground terminal 128 and/or 228. Circuit 500 may also include pads 596, 598.

FIG. 7B shows an exemplary schematic diagram of pin assignment for IC 502. For example, a first pin 612 of IC 502 may be assigned to reset circuitry such as reset circuitry 508. A second pin 614 may be assigned to aawake circuitry 550. A third pin 616 may be assigned to switch circuitry 540. A fourth pin 618 may be assigned to ground circuitry 606. A fifth pin 620 may be assigned to first digital output 510. A sixth pin 622 may be assigned to second digital output 520. A seventh pin 624 may be assigned to analog input 530. A seventh pin 626 may be assigned to circuitry 504 which may provide a positive voltage source, e.g., a 5V voltage source. IC 502 may be, for example, an ATTiny85 microcontroller.

Figure 8A:
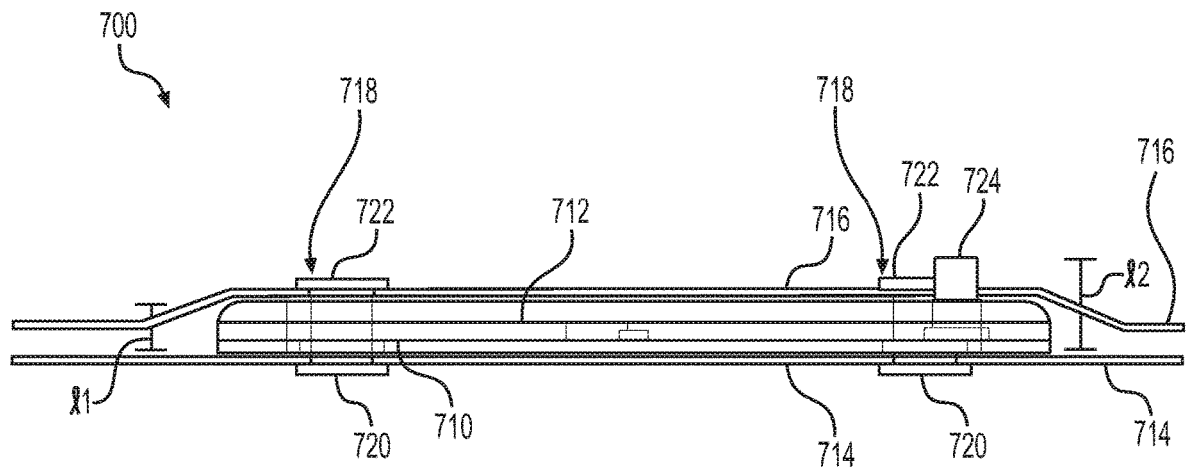
FIGS. 8A-8C depict aspects of exemplary flexible circuitry layers.
Figure 8B:
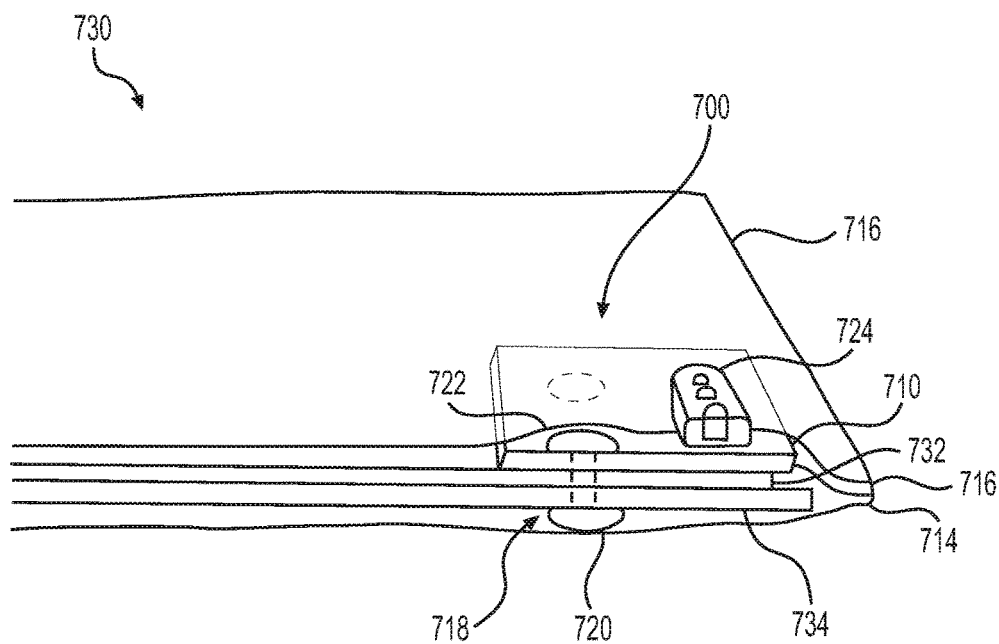
Figure 8C:
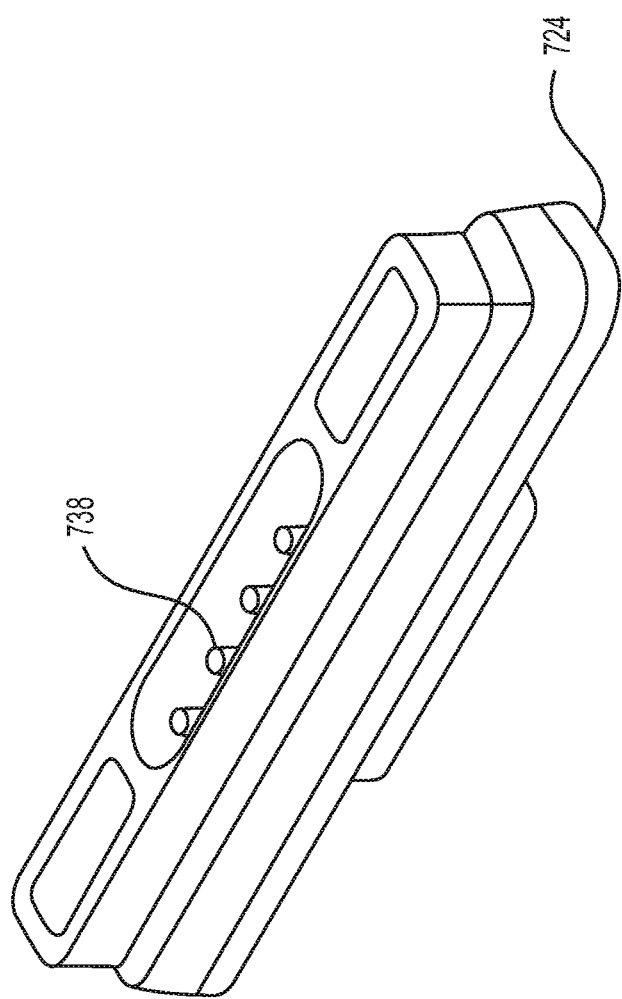
Figure 9:
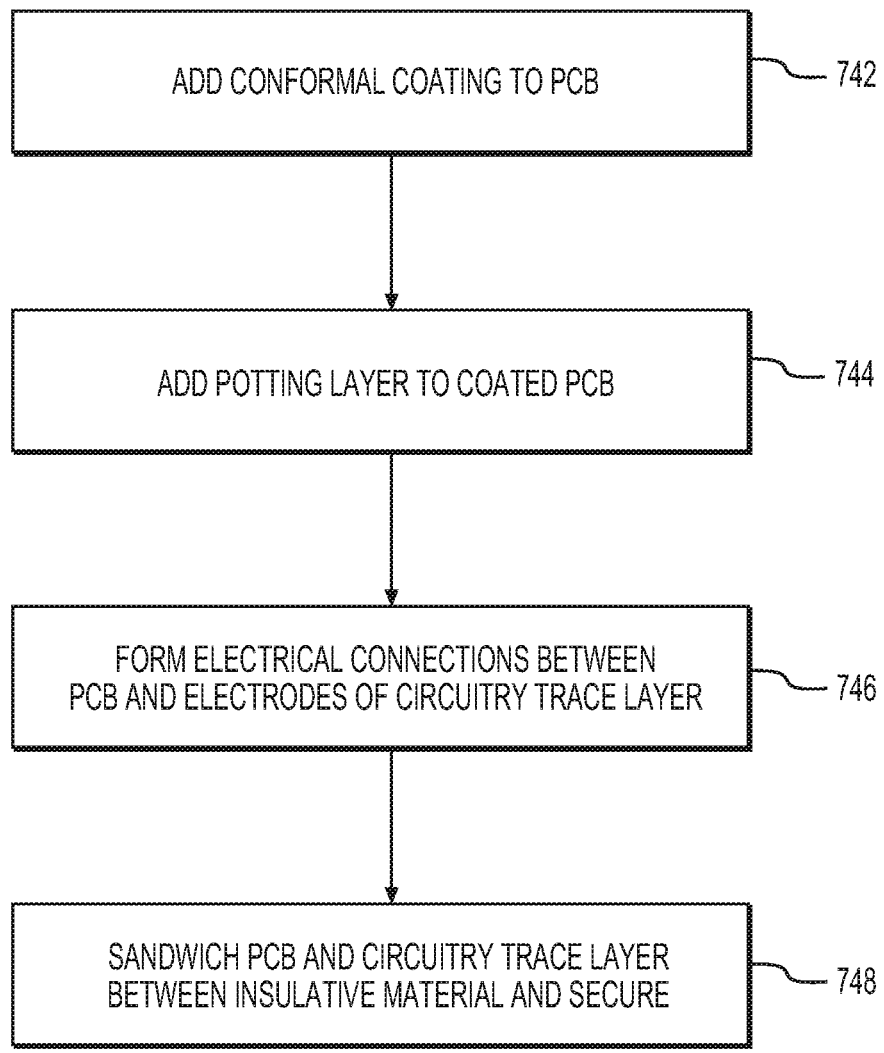
FIG. 9 depicts an exemplary method for manufacturing a flexible circuitry layer.

FIGS. 8A-8C show exemplary potential configurations for interfacing components, and FIG. 9 shows an exemplary method for constructing such interfacing components. The configurations shown in FIGS. 8A-8C may be used along with or in addition to aspects of FIGS. 2A-4, 7A, and 7B, discussed above. FIG. 8A shows a cross-section of an interfacing component 700. Interfacing component 700 may include a PCB 710. PCB 710 may be, for example, a flexible PCB. PCB 710 may be, for example, 0.8 mm PCB. PCB 710 may include a conformal coating, for example, a urethane-based conformal coating. Interfacing component 700 may also include an (optional) potting layer 712. Potting layer 712 may be, for example, an approximately 2.8 mm potting layer. Potting layer 712 may be, for example, urethane-based. PCB 710 combined with potting layer 712 may have a thickness l1. For example, thickness l1 may be approximately 3 mm to approximately 4 mm. For example, thickness l1 may be approximately 3.5 mm. Thickness l1 may be equal to a thickness of PCB 710 plus a thickness of potting layer 712. PCB 710 and potting layer 712 may be sandwiched between insulating layers 714, 716. Insulating layers 714, 716 may behave any of the qualities of insulative material. PCB 710, potting layer 712, and insulating layers 714, 716, may be held together with one or more connectors 718. For example, connectors 718 may be rivets which may include a bottom portion 720 and a top portion 722 and may include a grommet. Additionally or alternatively, a covering made of, for example, TPU may be used to encapsulate all portions of the interfacing component 700 (see FIG. 8B), including, e.g., connectors 718. Multiple layers of TPU may be used—for example, one layer of TPU may be under connectors 718, and one layer of TPU may be over connectors 718.

Interfacing component 700 may also include a connector 724, which may include, for example, one or more pogo pin connectors 738 (FIG. 8C). Connector 724 as pictured may be a male connector. In the alternative, connector 724 may be a female connector. While connector 724 is pictured as a pogo pin connector, such a depiction is merely exemplary. Connector 724 may have any of the qualities of connector 348, described above. Connector 724 may be used to interface with an external device such as external device 440, described above. Interfacing component, including connector 724, may have a thickness l2. For example, thickness l2 may be approximately 6 mm to approximately 7.5 mm. For example, thickness l2 may be approximately 6.0 mm. While FIGS. 8A-8B do not depict them specifically, component 700 may include features such as elements 140, 142, 144, 146, 240, 242, and/or 346, described above.

With reference to FIG. 9, a method for constructing interfacing component 700 may include step 742 of first adding a conformal coating to a PCB 710. Subsequently a potting layer 712 may be applied in step 744. Thereafter, PCB 710 and potting layer 712 may be placed (e.g., sandwiched) between insulating layers 714 and 716 in step 748 (step 746 will be discussed below). Thereafter, the insulating layers 714, 716 may be riveted to PCB 710 and potting layer 712 (forming, e.g., an overmolded PCB 710). Additionally or alternatively, a covering made of, for example, TPU may be applied to encapsulate all portions of the interfacing component 700 (see FIG. 8B).

FIG. 8B shows an exemplary circuitry layer 730 which may include an interfacing component 700. Circuitry layer 730 may have any of the features of circuitry layer 300, described above. The aspects of circuitry layer 730 described herein are not limiting and are merely descriptive. Interfacing component, as described above, may include a layer of PCB 710. While potting layer 712 is not separately depicted, interfacing component 700 may also include a potting layer such as potting layer 712.

In step 746 (FIG. 9), connections (e.g., electrical and/or mechanical connections) may be formed between PCB 710 and electrodes of a circuitry trace layer (e.g., circuitry trace layer 310 and/or 410). PCB 710 may be placed over a layer of conductive material 732. Conductive material 732 may be, for example, a conductive mesh or a conductive coating on a mesh. Conductive material 732 may have any of the features of circuitry layers 30 and/or 300 and/or of circuitry trace layers 310 and/or 410. Conductive material 732 may be formed on an insulative material or substrate 734. In the alternative, substrate 734 may be omitted (e.g., when a conductive mesh is used). Connectors 718 may be used to fix together PCB 710, conductive material 732, and/or substrate 734. Insulating layers 714, 716 may be placed over connectors 718. In the alternative, as described above with regard to FIG. 8A, connectors 718 may also be used to secure insulating layers 714, 716 and insulating layers 714, 716 may not cover connectors 718. In a further alternative, two layers of insulating material may be used (e.g., one below connectors 718 and one above connectors 718). Connectors 718 may be used to form electrical connections between elements of PCB 710 and conductive material 732. For example, connections may be formed between elements of PCB 710 and electrodes formed on conductive material 732. Further conductive material may also be used to form electrical connections between elements of PCB 710 and conductive material 732. For example, a conductive material may be, for example, a conductive epoxy or a conductive ink. In the alternative, a low temperature solder may be used to form an electrical connection between elements of PCB 710 and conductive material 732.

FIGS. 10A-10D depict various configurations of LED components 750, 760, which may be used as, for example, components 416, described above. Components 416 may be operated by portions of circuit 510, e.g. input/output circuitry 510 or 520. Switch circuitry 540 may also be used to activate or deactivate LED components 750, 760. LED components 750, 760 may include any LED technology which is known or may become known.

Figure 10A:
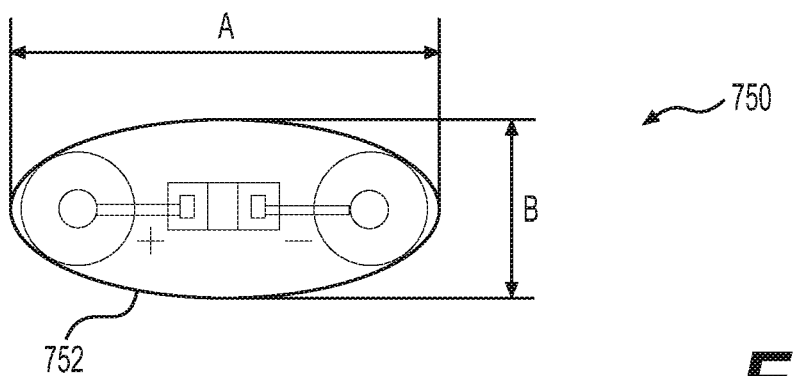
FIGS. 10A-10D and 11 depict exemplary components for use with a flexible circuitry layer.
Figure 10B:
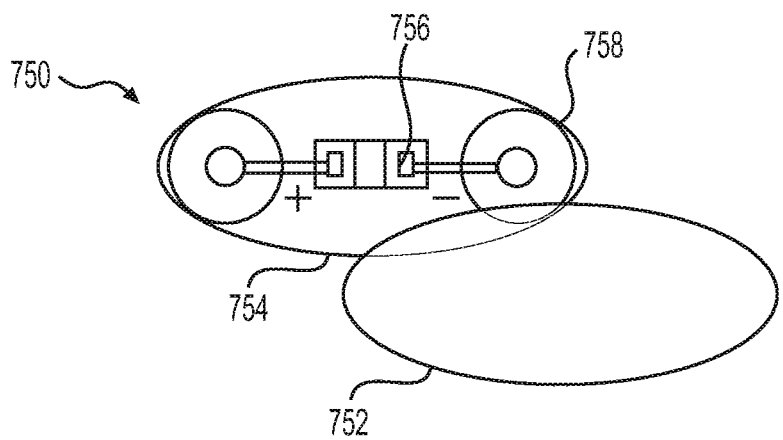

As shown in FIGS. 10A and 10B, an LED component 750 includes a cover 754 and a PCB 752. PCB 754 may be a flex PCB. Cover 752 may be, for example, a clear plastic over layer. In the alternative, cover 752 may be a different color or may include an additional over layer which may be a different color so as to cast light which is the color of the cover and/or layer. Cover 752 may be watertight and accommodate an optional drill hole 758 (described below). FIG. 10A shows LED component 750 with cover 752 in place, and FIG. 10B shows LED component 750 with cover 752 displaced. LED component 750 may have a rounded shape. For example, LED component 750 may be circular or ovular. LED component 750 may have a length A and a width B. For example, length A may be approximately 19.5 mm. Length A may also include a range of other lengths—e.g., lengths between approximately 10 mm and approximately 30 mm. Width B may be approximately 8.3 mm. Width B may also include a range of other widths—e.g., widths between approximately 5 mm and approximately 15 mm.

LED component 750 may include a diode 756. For example, diode 756 may have a thickness of between approximately 0.5 mm and 2.0 mm. For example, diode 756 may have a thickness of approximately 1.1 mm. Diode 756 may have an operating voltage or approximately 2 V to approximately 3.7 V. In an alternative, Diode 756 may be compatible with a higher voltage such as 7.2 V. Diode 756 may be, for example, an RBG LED and/or an individually addressable LED.

LED component 750 may also include a drill hole 758. For example, drill hole 758 may be a copper drill hole. Drill hole 758 may be approximately 2 mm in diameter. Drill hole 758 may include a 1.5 mm ring around the hole. Drill hole 758 may be used to attach an LED component to a circuitry layer (e.g., circuitry layers 30, 300, and/or 730.) Drill holes 758 may be used to form both mechanical and electrical connections. In the alternative, LED component 750 may not include a drill hole and may be attached to a circuitry layer by another mechanism.

Figure 10C:
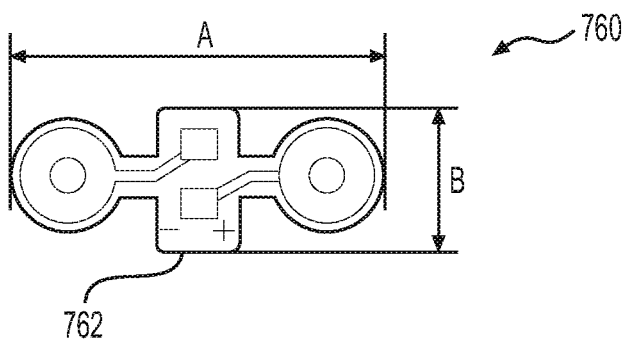
Figure 10D:
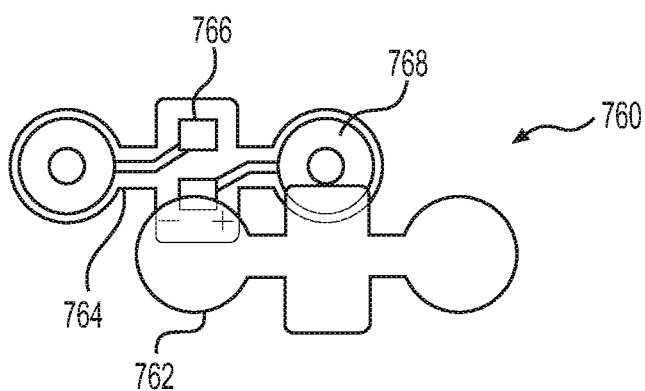

FIGS. 10C and 10D show an alternative LED component 760. LED 760 includes a cover 762 and a PCB 764. PCB 764 may have any of the features of PCB 754, described above. Cover 764 may have any of the qualities of cover 754, described above. FIG. 10C shows LED component 760 with cover 762 in place, and FIG. 10D shows LED component 760 with cover 762 displaced. LED component 760 may have a length A and a width B. Length A may be between approximately 10 mm and approximately 30 mm. For example, length A may be approximately 19 mm. Width B may have a width of between approximately 5 mm and 10 mm. For example, width B may be approximately 7.5 mm.

LED component 760 may include a substantially rectangular central portion on which diodes 766 may be fixed. Diode 766 may have any of the features of diode 756, described above. LED component 760 may also have substantially round portions on either end of LED component 760 which include one or more drill holes 768. Drill holes 768 may have any of the qualities of drill holes 758, described above. In the alternative, LED component 760 may lack drill holes. A narrow band of substrate may connect the roughly rectangular central portion and the round end portions of LED component 760.

LED components 750, 760 as described above may be able to withstand mechanical flexing, moisture, and high temperatures (e.g., temperatures above 350 degrees F.). LED components 750, 760 may have rounded edges so as to not cause any sharpness or discomfort for a user who may be using a circuitry layer incorporating an LED component 750, 760. LED components 750, 760 may incorporate kapton and/or polyester which is flexible and/or quiet.

Figure 11:
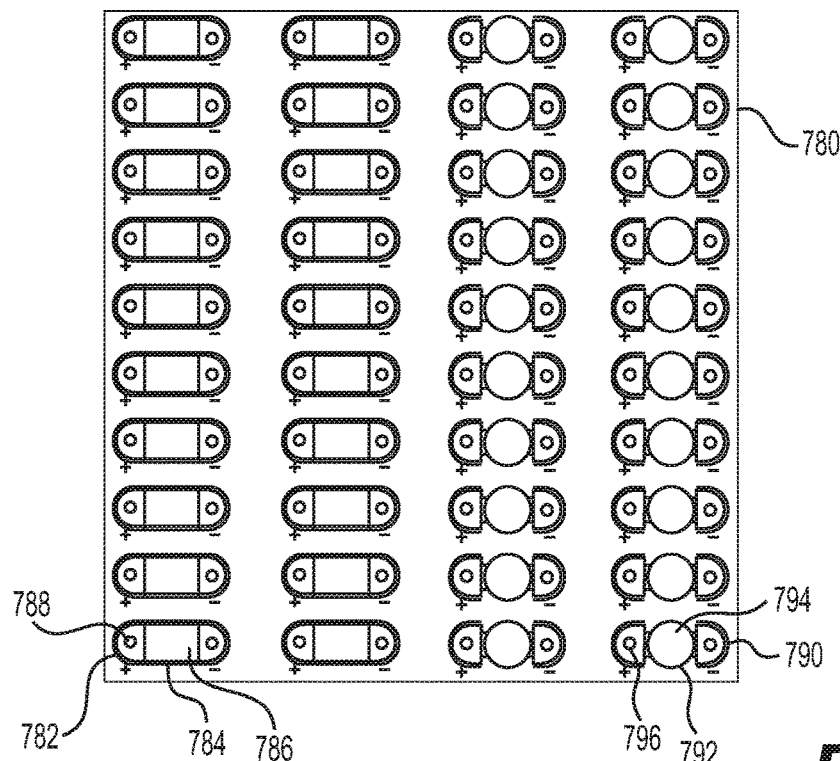

FIG. 11 shows a sheet 780 of LED components 782, 790. For example, LED components 750, 760 may be printed onto a backing such as a clear plastic backing. LED components 782, 790 may have any of the properties of LED components 750, 760 above. For example, an LED component 782 may include a flexible substrate 784, a diode portion 786, and at least one drill hole 788. In the alternative, LED component 782 may lack a drill hole. LED component 782 may be rounded. For example, LED component 782 may be rounded, oblong, or ovular. Flexible substrate 784 may have any of the qualities of PCB 754, 764 described above. Diode portion 782 may have any of the qualities of diodes 765, 766 described above. Drill hole 788 may have any of the qualities of drill holes 758, 768 described above. In the alternative, no drill hole may be present. Drill holes 788 of LED component 782 may be placed on substantially semicircular shaped portions of LED component 782 and/or flexible substrate 784. Diode portion 782 may be substantially rectangular.

As a further example, LED component 790 may include a flexible substrate 792, a diode portion 794, and at least one drill hole 796. Flexible substrate 792 may have any of the qualities of PCB 754, 764 described above. Diode portion 782 may have any of the qualities of diodes 765, 766 described above. Drill hole 796 may have any of the qualities of drill holes 758, 768, 788 described above. In the alternative, drill holes may not be present. Drill holes 796 of LED component 782 may be placed on substantially semicircular shaped portions of LED component 782 and/or flexible substrate 784. Diode portion 782 may be substantially circular.

Figure 12:
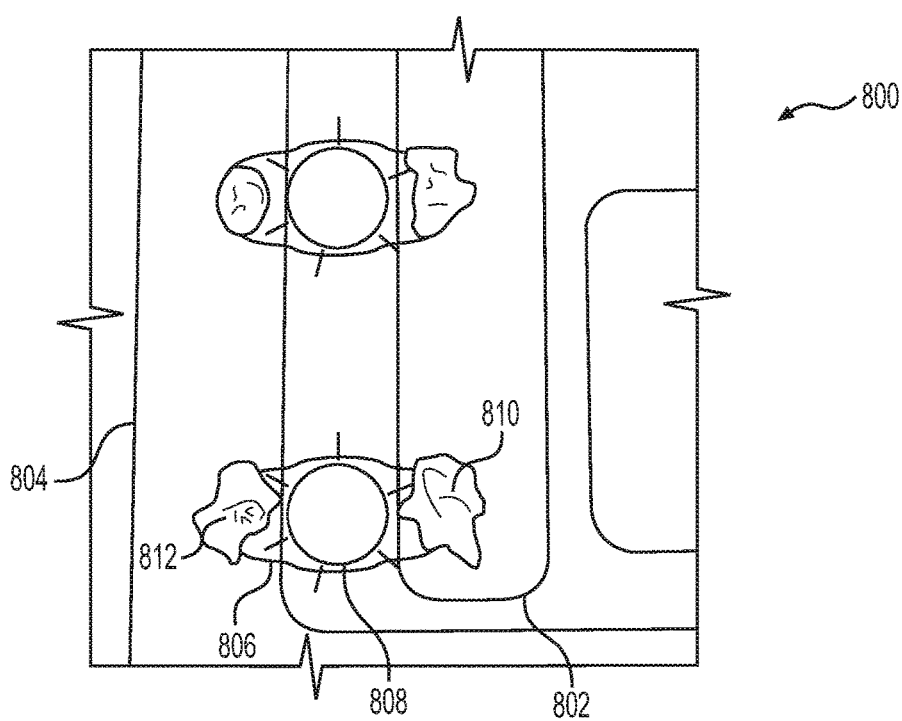
FIGS. 12 and 13A-13D depict exemplary components affixed to a circuitry layer.

FIG. 12 shows an exemplary circuitry layer 800. Circuitry layer 800 may include, for example, conductive material forming a circuitry traces 802, 804. Circuitry traces 802, 804 may be formed via, for example, chemical or mechanical subtractive manufacturing. Circuitry traces 802, 804 may be formed from, for example, a conductive mesh or a conductive material. Circuitry traces 802, 804 may have any of the qualities of circuitry layers 30 and/or 300 and/or circuitry trace layers 310 and/or 410, described above. A component 806 may be connected electrically and/or mechanically to circuitry traces 802, 804. For example, component 806 may have any of the qualities of LED components 750, 760, 782, and/or 790, described above and may include a diode portion 808. In the alternative, component 806 may be another type of component (e.g., a motor, a sensor, etc.). For example, component 806 may have any of the properties of components 416, described above.

Component 806 may be fixed to circuitry traces 802, 804. For example, component 806 may be fixed using a conductive material such as conductive epoxy, conductive ink, or solder such as low-temperature solder. Additional or alternative connections 812 may be made via, for example, a drill hole (such as drill holes 758, 768, 788, and/or 796, described above). For example, a connection 812 may be formed using, e.g., conductive thread, conductive wire, or another conductive material which may connect a component 806 to circuitry traces 802, 804.

Figure 13A:
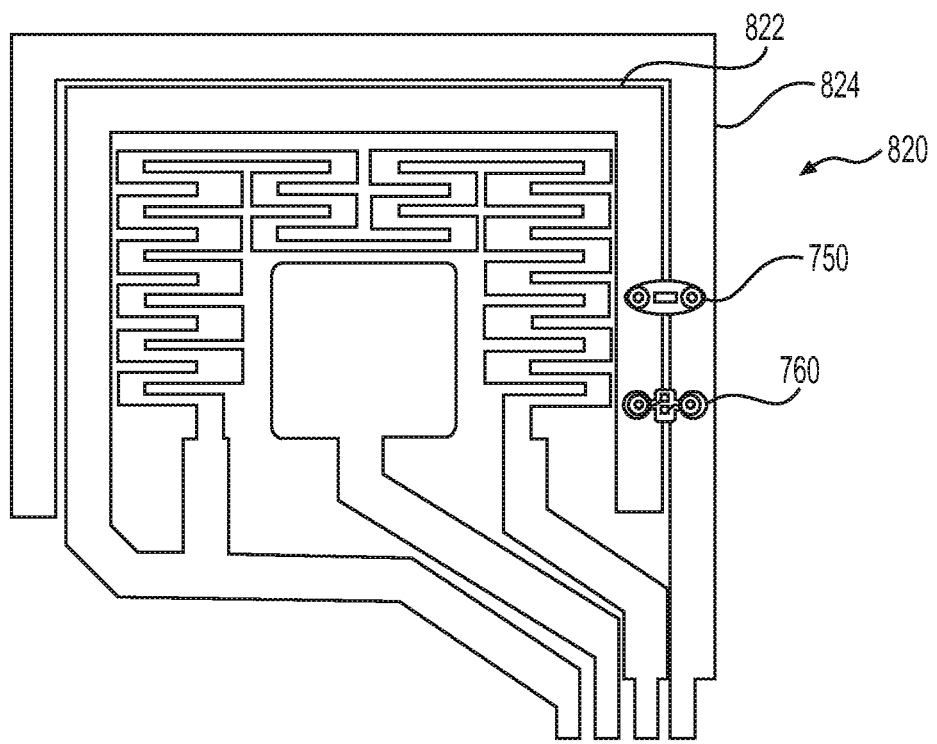
Figure 13B:
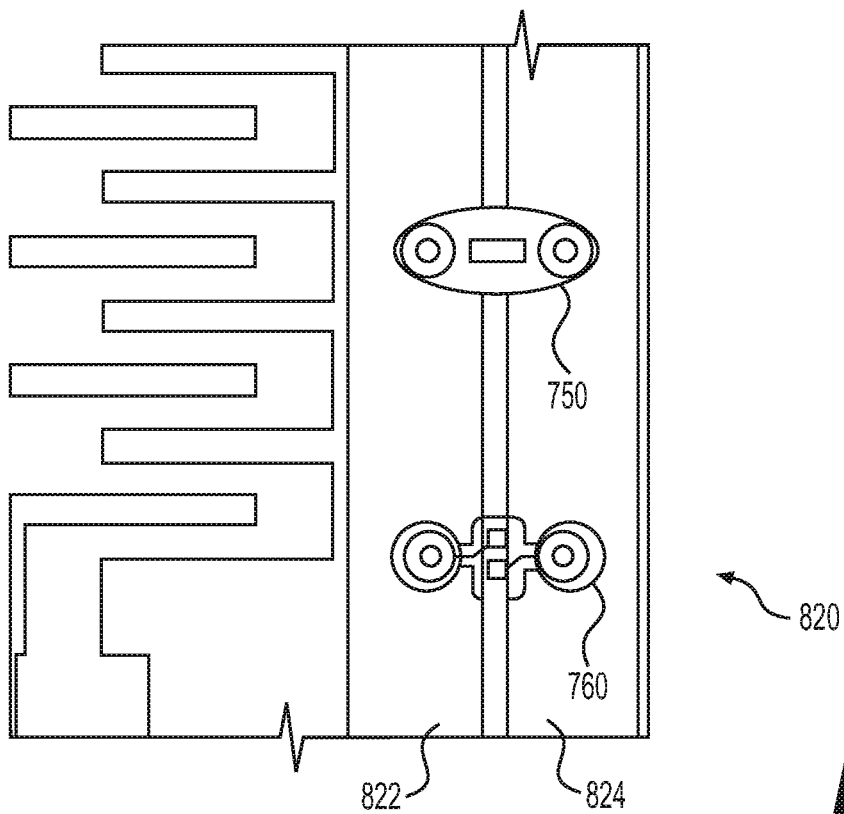

FIGS. 13A-13D show a further example of an exemplary circuitry layer 820. FIG. 13A shows a view of circuitry layer 820 from a distance, and FIG. 13B shows a more close-up view of circuitry layer 820. Circuitry layer 820 may include circuitry traces 822, 824, which may have any of the properties of circuitry traces 802, 804 and circuitry layer 30, described above. Components 750, 760 may be mounted to circuitry layer 820 via any of the mechanisms described above with regard to FIG. 12 or any of the other examples described herein.

Figure 13C:
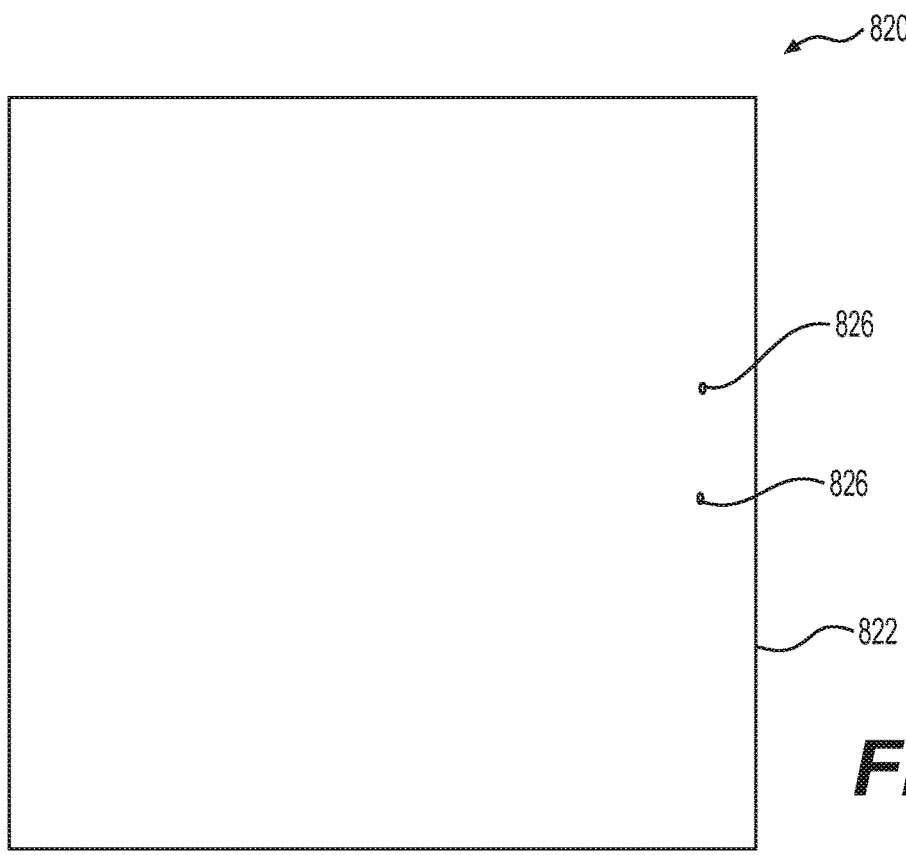
Figure 13D:
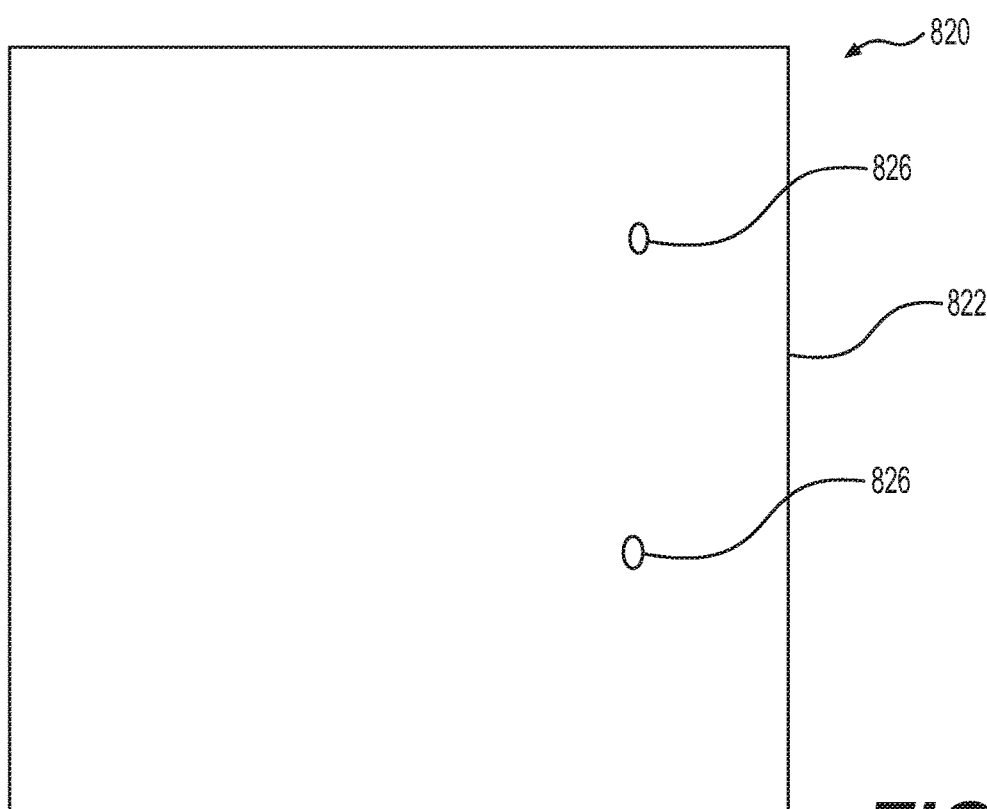

FIG. 13C depicts an exemplary circuitry layer 820 inserted in a soft good 822. FIG. 13C depicts circuitry layer 820 from a distance, and FIG. 13D shows a more close-up view of circuitry layer 820. Soft good 822 may have any of the properties of soft good 10, described above. Soft good 822 may have one or more portals 826 for providing access and/or viewing of a component 750, 760. For example, portals 826 may be a hole (which may be covered with a film or a sheer material). Portals 826 may be sized to expose all or a portion of a component 750, 760.

These and other embodiments of the systems and methods may be used as would be recognized by those skilled in the art. The above descriptions of various systems and methods are intended to illustrate specific examples and describe certain ways of making and using the systems disclosed and described here. These descriptions are neither intended to be nor should be taken as an exhaustive list of the possible ways in which these systems can be made and used. A number of modifications, including substitutions of systems between or among examples and variations among combinations can be made. Those modifications and variations should be apparent to those of ordinary skill in this area after having read this disclosure.

The systems, apparatuses, devices, and methods disclosed herein are described in detail by way of examples and with reference to the figures. The examples discussed herein are examples only and are provided to assist in the explanation of the apparatuses, devices, systems and methods described herein. None of the features or components shown in the drawings or discussed below should be taken as mandatory for any specific implementation of any of these the apparatuses, devices, systems or methods unless specifically designated as mandatory. For ease of reading and clarity, certain components, modules, or methods may be described solely in connection with a specific figure. In this disclosure, any identification of specific techniques, arrangements, etc. are either related to a specific example presented or are merely a general description of such a technique, arrangement, etc. Identifications of specific details or examples are not intended to be, and should not be, construed as mandatory or limiting unless specifically designated as such. Any failure to specifically describe a combination or sub-combination of components should not be understood as an indication that any combination or sub-combination is not possible. It will be appreciated that modifications to disclosed and described examples, arrangements, configurations, components, elements, apparatuses, devices, systems, methods, etc. can be made and may be desired for a specific application. Also, for any methods described, regardless of whether the method is described in conjunction with a flow diagram, it should be understood that unless otherwise specified or required by context, any explicit or implicit ordering of steps performed in the execution of a method does not imply that those steps must be performed in the order presented but instead may be performed in a different order or in parallel.

Reference throughout the specification to "various embodiments," "some embodiments," "one embodiment," "some example embodiments," "one example embodiment," or "an embodiment" means that a particular feature, structure, or characteristic described in connection with any embodiment is included in at least one embodiment. Thus, appearances of the phrases "in various embodiments," "in some embodiments," "in one embodiment," "some example embodiments," "one example embodiment, or "in an embodiment" in places throughout the specification are not necessarily all referring to the same embodiment. Furthermore, the particular features, structures or characteristics may be combined in any suitable manner in one or more embodiments.

Throughout this disclosure, references to components or modules generally refer to items that logically can be grouped together to perform a function or group of related functions. Like reference numerals are generally intended to refer to the same or similar components. Those of ordinary skill in the art will recognize that the systems, apparatuses, devices, and methods described herein can be applied to, or easily modified for use with, other types of applications.

It is intended that the specification and examples be considered as exemplary only, with a true scope and spirit of the invention being indicated by the following claims.

What is claimed is:

1. An electronic element, comprising:
   a first piece of conductive mesh including a capacitive touch portion;
   a second piece of conductive mesh; and
   an insulating material disposed between at least a portion of the first piece of conductive mesh and at least a portion of the second piece of conductive mesh;
   wherein deformation of the first piece of conductive mesh relative to the second piece of conductive mesh is operative to control a component of a circuit that includes at least one of the first piece of conductive mesh or the second piece of conductive mesh, wherein at least one of the first piece of conductive mesh or the second piece of conductive mesh includes at least one high-pitch circuitry trace and is electronically connected to an interfacing component, and wherein the interfacing component includes circuitry for transitioning between the at least one high-pitch circuitry trace and at least one low-pitch element of the interfacing component.

2. The electronic element of claim 1, wherein the deformation causes the first piece of conductive mesh to become closer to the second piece of conductive mesh.

3. The electronic element of claim 1, wherein the deformation is operative to turn the component from a first state to a second state.

4. The electronic element of claim 1, wherein the first piece of conductive mesh is deformed via contact of a user's hand.

5. The electronic element of claim 1, wherein the interfacing component includes (a) a flexible substrate and (b) a terminal electrically connected to the high-pitch circuitry component.

6. The electronic element of claim 5, wherein the interfacing component further includes a connector configured to be detachably connected to an external device.

7. The electronic element of claim 1, further comprising a printed LED.

8. The electronic element of claim 1, wherein the first piece of conductive mesh is deformed via contact of a user's hand.

9. An electronic element, comprising:
a first piece of conductive mesh including a capacitive touch portion, the first piece of conductive mesh configured to be in electrical connection with a component; and
a second piece of conductive mesh separated from the first piece of conductive mesh by an insulative material;
wherein, when a portion of the first piece of conductive mesh has a first position relative to a portion of the second piece of conductive mesh, the component is in a first electrical state and, when the portion of the first piece of conductive mesh has a second position, different from the first position, relative to the portion of the second piece of conductive mesh, the component is in a second electrical state, different from the first state, and wherein at least one of the first piece of conductive mesh or the second piece of conductive mesh includes at least one high-pitch circuitry trace.

10. The electronic element of claim 9, the first piece of conductive mesh is closer to the second piece of conductive mesh in the second position than in the first position.

11. The electronic element of claim 9, wherein the first electrical state is an off state, and wherein the second electrical state is an on state.

12. The electronic element of claim 9, wherein, when the first piece of conductive mesh is in the second position, at least one of the first piece of conductive mesh or the second piece of conductive mesh has been deformed relative to when the first piece of conductive mesh is in the first position.

13. The electronic element of claim 9, wherein the at least one of the first piece of conductive mesh or the second piece of conductive mesh is electrically connected to an interfacing component.

14. The electronic element of claim 13, wherein the interfacing component includes circuitry for transitioning between the at least one high-pitch circuitry trace and at least one low-pitch element of the interfacing component.

15. The electronic element of claim 9, further comprising a printed LED.

16. An electronic element, comprising:
a first piece of conductive mesh including a capacitive touch portion, the first piece of conductive mesh configured to be in electrical connection with a component;
a second piece of conductive mesh; and
an insulating material disposed between at least a portion of the first piece of conductive mesh and the second piece of conductive mesh;
wherein deformation of the first piece of conductive mesh relative to the second piece of conductive mesh causes the component to transition from a first electrical state to a second electrical state, and wherein at least one of the first piece of conductive mesh or the second piece of conductive mesh includes at least one high-pitch circuitry trace.

17. The electronic element of claim 16, wherein the deformation causes the first piece of conductive mesh to become closer to the second piece of conductive mesh.

18. The electronic element of claim 16, wherein the first electrical state is an off state, and wherein the second electrical state is an on state.

19. The electronic element of claim 16, wherein the at least one of the first piece of conductive mesh or the second piece of conductive mesh is electrically connected to an interfacing component.

20. The electronic element of claim 19, wherein the interfacing component includes circuitry for transitioning between the at least one high-pitch circuitry trace and at least one low-pitch element of the interfacing component.

* * * * *